United States Patent
Yi et al.

(10) Patent No.: US 12,433,115 B2
(45) Date of Patent: Sep. 30, 2025

(54) DISPLAY SUBSTRATE AND DISPLAY PANEL WITH OVERLAPPING CONDUCTOR LAYER IN PERIPHERAL AREA

(71) Applicants: Chengdu BOE Optoelectronics Technology Co., Ltd., Chengdu (CN); BOE Technology Group Co., Ltd., Beijing (CN)

(72) Inventors: Hong Yi, Beijing (CN); Zhengkun Li, Beijing (CN); Jun Yan, Beijing (CN); Mengqi Wang, Beijing (CN); De Li, Beijing (CN); Haigang Qing, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 926 days.

(21) Appl. No.: 17/628,689

(22) PCT Filed: Feb. 24, 2021

(86) PCT No.: PCT/CN2021/077722
§ 371 (c)(1),
(2) Date: Jan. 20, 2022

(87) PCT Pub. No.: WO2022/178725
PCT Pub. Date: Sep. 1, 2022

(65) Prior Publication Data
US 2022/0344442 A1    Oct. 27, 2022

(51) Int. Cl.
*H10K 59/131*    (2023.01)

(52) U.S. Cl.
CPC .............................. *H10K 59/131* (2023.02)

(58) Field of Classification Search
CPC .................................................. H10K 59/131
See application file for complete search history.

(56) References Cited

U.S. PATENT DOCUMENTS

| 10,514,814 | B2 | 12/2019 | Fu et al. |
| 10,600,812 | B2 * | 3/2020 | Hsu .................... G02F 1/13439 |
| 10,983,618 | B2 | 4/2021 | Shang |

(Continued)

FOREIGN PATENT DOCUMENTS

| CN | 102270413 A | 12/2011 |
| CN | 105867035 A | 8/2016 |

(Continued)

*Primary Examiner* — Lex H Malsawma
(74) *Attorney, Agent, or Firm* — Westman Champlin & Koehler, P.A.

(57) ABSTRACT

A display substrate and a display panel, the display substrate includes a base substrate and a plurality of sub-pixels, a plurality of data lines and a plurality of data wirings located on the base substrate. The plurality of data wirings includes a first data wiring, a second data wiring and a third data wiring that are periodically arranged. The first data wiring is located in a first conductor layer. The second data wiring is located in a second conductor layer. The third data wiring is located in a third conductor layer. An orthographic projection of a part of at least one first data wiring on the base substrate overlaps with an orthographic projection of a part of at least one third data wiring on the base substrate.

13 Claims, 17 Drawing Sheets

(56) References Cited

U.S. PATENT DOCUMENTS

| | | | | |
|---|---|---|---|---|
| 11,640,092 | B2* | 5/2023 | Koide | G06F 3/044 |
| | | | | 257/773 |
| 11,662,637 | B2* | 5/2023 | Abe | G02F 1/136286 |
| | | | | 345/98 |
| 2007/0285370 | A1* | 12/2007 | Kim | G09G 3/20 |
| | | | | 345/87 |
| 2008/0129944 | A1* | 6/2008 | Park | G02F 1/1345 |
| | | | | 349/150 |
| 2014/0117320 | A1* | 5/2014 | Jung | H10K 59/131 |
| | | | | 257/40 |
| 2014/0291846 | A1* | 10/2014 | Chai | G02F 1/1345 |
| | | | | 257/749 |
| 2015/0356937 | A1* | 12/2015 | Fujikawa | G02F 1/13452 |
| | | | | 345/87 |
| 2016/0172428 | A1* | 6/2016 | Song | H10K 59/131 |
| | | | | 257/40 |
| 2018/0130856 | A1* | 5/2018 | Kim | H10K 77/111 |
| 2019/0018526 | A1* | 1/2019 | Fu | G06F 3/047 |
| 2019/0103455 | A1* | 4/2019 | Song | H10K 59/131 |
| 2019/0212855 | A1 | 7/2019 | Shang | |
| 2020/0225791 | A9 | 7/2020 | Shang | |
| 2021/0305285 | A1 | 9/2021 | Long et al. | |

FOREIGN PATENT DOCUMENTS

| | | |
|---|---|---|
| CN | 107037646 A | 8/2017 |
| CN | 207557624 U | 6/2018 |
| CN | 108878444 A | 11/2018 |
| CN | 209055780 U | 7/2019 |
| CN | 110286513 A | 9/2019 |
| CN | 111367129 A | 7/2020 |

\* cited by examiner

DISPLAY SUBSTRATE AND DISPLAY PANEL WITH OVERLAPPING CONDUCTOR LAYER IN PERIPHERAL AREA

CROSS REFERENCE TO RELATED APPLICATION(S)

This application is a Section 371 National Stage Application of International Application No. PCT/CN2021/077722, filed on Feb. 24, 2021, entitled "DISPLAY SUBSTRATE AND DISPLAY PANEL", the contents of which is incorporated herein by reference in its entirety.

TECHNICAL FIELD

The present disclosure relates to a field of display technology, and in particular to a display substrate and a display panel.

BACKGROUND

With the development of display technology, more and more electronic devices have stricter requirements on a size of frame and a frame being narrower and narrower is desired. Therefore, it is desired for wirings of display substrate to occupy as little space as possible while meeting electrical and technological requirements. The traditional method is to decrease a width of the wirings, but as the width of the wirings decreases, it becomes more and more difficult to implement in the process.

SUMMARY

According to one aspect of the present disclosure, there is provided a display substrate including:
- a base substrate including a display area and a peripheral area surrounding the display area;
- a plurality of sub-pixels in the display area;
- a plurality of data lines in the display area, wherein the plurality of data lines are arranged in a first direction and extend in a second direction, and the plurality of data lines are connected to the plurality of sub-pixels;
- a plurality of data wirings in the peripheral area, wherein the plurality of data wirings are located on a side of the display area in the second direction, and the plurality of data wirings are respectively connected to the plurality of data lines,
- wherein the plurality of data wirings includes a first data wiring, a second data wiring and a third data wiring that are periodically arranged, wherein the first data wiring is located in a first conductor layer, the second data wiring is located in a second conductor layer, and the third data wiring is located in a third conductor layer, wherein the first conductor layer is located on a side of the base substrate facing the plurality of sub-pixels, the second conductor layer is located on a side of the first conductor layer away from the base substrate, the third conductor layer is located on a side of the second conductor layer away from the base substrate, and an orthographic projection of a part of at least one first data wiring on the base substrate overlaps with an orthographic projection of a part of at least one third data wiring on the base substrate.

For example, a bending area is disposed in the peripheral area, the bending area is located on a side of the plurality of data wirings away from the display area in the second direction, the display substrate further includes a plurality of patterned wirings in the bending area, and the plurality of patterned wirings are correspondingly connected to the plurality of data wirings.

For example, the data wiring includes a first sub-data-wiring, a second sub-data-wiring and a third sub-data-wiring, the first sub-data-wiring is connected to at least one data line of the plurality of data lines, the third sub-data-wiring is connected to at least one patterned wiring of the plurality of patterned wirings, and the second sub-data-wiring is connected between the first sub-data-wiring and the third sub-data-wiring,
- wherein an orthographic projection of the second sub-data-wiring of the at least one first data wiring on the base substrate at least partially overlaps with an orthographic projection of the second sub-data-wiring of the at least one third data wiring on the base substrate.

For example, the display substrate further includes a plurality of connecting wirings in the peripheral area, wherein the plurality of connecting wirings are located on a side of the bending area away from the display area in the second direction, and the plurality of connecting wirings are correspondingly connected to the plurality of patterned wirings,
- wherein the plurality of connecting wirings include a first connecting wiring, a second connecting wiring and a third connecting wiring that are periodically arranged, wherein the first connecting wiring is located in the first conductor layer, the second connecting wiring is located in the second conductor layer, and the third connecting wiring is located in the third conductor layer.

For example, each first data wiring is connected to one third connecting wiring through one patterned wiring, each second data wiring is connected to one third connecting wiring through one patterned wiring, and each third data wiring is connected to one first connecting wiring or one second connecting wiring through one patterned wiring.

For example, in any two adjacent third data wirings, one third data wiring is connected to the first connecting wiring through one patterned wiring, the other one third data wiring is connected to the second connecting wiring through one patterned wiring.

For example, the connecting wiring includes a first sub-connecting-wiring and a second sub-connecting-wiring, the first sub-connecting-wiring is connected to one patterned wiring of the plurality of patterned wirings, and the second sub-connecting-wiring is connected to the first sub-connecting-wiring,
- wherein the first sub-connecting-wiring of at least one of the plurality of connecting wirings extends to respective patterned wiring in a polyline shape.

For example, the display substrate further includes an auxiliary circuit in the peripheral area, wherein the auxiliary circuit is located on a side of the plurality of connecting wirings away from the display area in the second direction,
- the connecting wirings further include a third sub-connecting-wiring, the third sub-connecting-wiring is connected to the auxiliary circuit, the second sub-connecting-wiring is connected between the first sub-connecting-wiring and the third sub-connecting-wiring.

For example, the auxiliary circuit includes an electrostatic discharging circuit, the electrostatic discharging circuit includes a plurality of electrostatic discharging units, the plurality of electrostatic discharging units are connected to third sub-connecting-wirings of the plurality of connecting wirings in one-to-one correspondence.

For example, the plurality of data wirings are divided into a plurality of sets of data wirings, wherein third sub-data-wirings of two data wirings that belong to two adjacent sets and are adjacent to each other are separated by a first distance in the first direction, third sub-data-wirings of two data wirings that belong to the same set and are adjacent to each other are separated by a second distance in the first direction, and the second distance is smaller than the first distance.

For example, the plurality of connecting wirings are divided into a plurality sets of connecting wirings, wherein first sub-connecting-wirings of two data wirings that belong to two adjacent sets and are adjacent to each other are separated by a third distance in the first direction, first sub-connecting-wirings of two data wirings that belong to the same set and are adjacent to each other are separated by a fourth distance in the first direction, and the fourth distance is smaller than the third distance.

For example, at least one set of connecting wirings is divided into a first sub-set of connecting wirings, a second sub-set of connecting wirings and a third sub-set of connecting wirings, and the first sub-set of connecting wirings and the third sub-set of connecting wirings are located on two sides of the second sub-set of connecting wirings respectively in the first direction, wherein,
- in the first sub-set of connecting wirings, a first sub-connecting-wiring of each of the first connecting wiring and the second connecting wiring extends in a polyline shape to the patterned wirings, and a part extending in polyline shape of the first sub-connecting-wiring of each of the first connecting wiring and the second connecting wiring has a length that gradually decreases in the first direction;
- in the third sub-set of connecting wirings, a first sub-connecting-wiring of each of the first connecting wiring and the second connecting wiring extends in a polyline shape to the patterned wirings, and a part extending in polyline shape of the first sub-connecting-wiring of each of the first connecting wiring and the second connecting wiring has a length that gradually increases in the first direction.

For example, at least one of the plurality of sub-pixels includes:
- a thin film transistor having a gate electrode, a source electrode and a drain electrode;
- an interlayer insulating layer located between the gate electrode and the source electrode and between the gate electrode and the drain electrode;
- a first gate insulating layer located on a side of the interlayer insulating layer facing the base substrate;
- a second gate insulating layer located between the interlayer insulating layer and the first gate insulating layer; and
- a capacitor, wherein a first electrode of the capacitor and the gate electrode are disposed in the same layer, a second electrode of the capacitor is disposed between the interlayer insulating layer and the second gate insulating layer,
- wherein the first data wiring and the gate electrode are disposed in the same layer, the second data wiring and the second electrode of the capacitor are disposed in the same layer, and the third data wiring is disposed in a layer where the source electrode or the drain electrode is disposed.

For example, at least one electrostatic discharging unit includes a first transistor, a second transistor, a third transistor and a fourth transistor, a gate electrode and a first electrode of the first transistor, a gate electrode and a first electrode of the second transistor, a second electrode of the third transistor and a second electrode of the fourth transistor are connected to respective one third sub-connecting-wiring, a second electrode of the first transistor and a second electrode of the second transistor are connected to a low voltage signal line, and a gate electrode and a first electrode of the third transistor and a gate electrode and a first electrode of the fourth transistor are connected to a high voltage signal line.

For example, the auxiliary circuit further includes a unit testing circuit, the unit testing circuit includes a plurality of unit testing sub-circuits, the plurality of unit testing sub-circuits are connected to the third sub-connecting-wirings of the plurality of connecting wirings in one-to-one correspondence.

For example, an orthographic projection of the second sub-data-wiring of at least one first data wiring on the base substrate completely overlaps with an orthographic projection of the second sub-data-wiring of at least one third data wiring on the base substrate, and an orthographic projection of the second sub-data-wiring of at least one second data wiring on the base substrate does not overlap with each of the orthographic projection of the second sub-data-wiring of at least one first data wiring on the base substrate and the orthographic projection of the second sub-data-wiring of at least one third data wiring on the base substrate.

For example, the plurality of sets of data wirings include a first set of data wirings, a second set of data wirings, a third set of data wirings, a fourth set of data wirings, a fifth set of data wirings and a sixth set of data wirings arranged in the first direction, wherein the first set of data wirings and the sixth set of data wiring are symmetrically disposed with respect to a symmetry axis of the display substrate in the second direction, the second set of data wirings and the fifth set of data wirings are symmetrically disposed with respect to the symmetry axis, and the third set of data wirings and the fourth set of data wirings are symmetrically disposed with respect to the symmetry axis.

For example, the plurality of sets of connecting wirings include a first set of connecting wirings, a second set of connecting wirings, a third set of connecting wirings, a fourth set of connecting wirings, a fifth set of connecting wirings and a sixth set of connecting wirings arranged in the first direction, wherein the first set of connecting wirings and the sixth set of data wiring are symmetrically disposed with respect to a symmetry axis of the display substrate in the second direction, the second set of connecting wirings and the fifth set of connecting wirings are symmetrically disposed with respect to the symmetry axis, and the third set of connecting wirings and the fourth set of connecting wirings are symmetrically disposed with respect to the symmetry axis.

According to another aspect of the present disclosure, a display panel is provided, including the display substrate mentioned above.

DETAILED DESCRIPTION OF EMBODIMENTS

Figure 1:
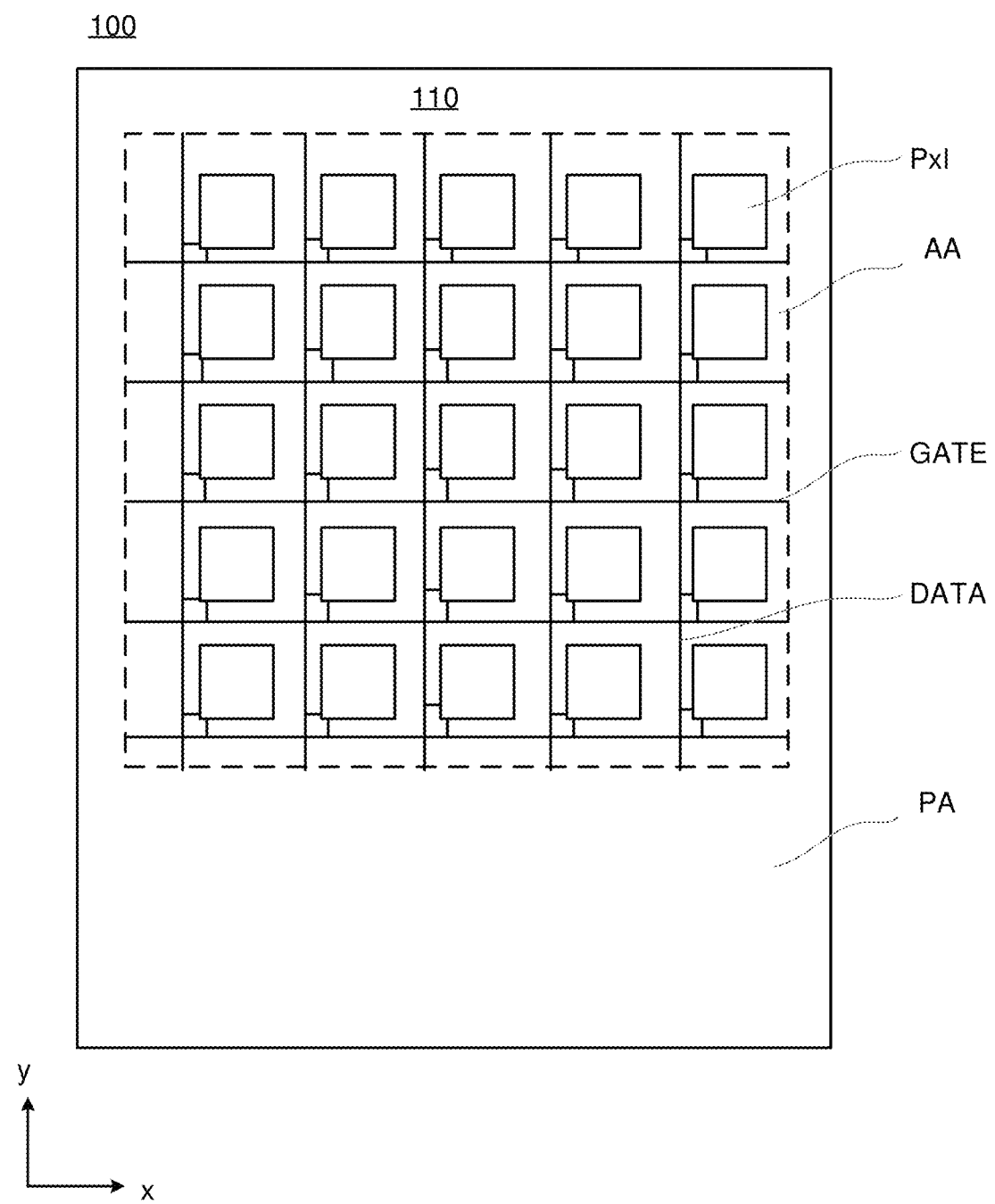
FIG. 1 illustrates a schematic view of a display area of a display substrate according to the embodiments of the present disclosure.

In order to make the objectives, technical solutions and advantages of the embodiments of the present disclosure clearer, the technical solutions in the embodiments of the present disclosure will be described clearly and completely in conjunction with the drawings in the embodiments of the present disclosure. Obviously, the described embodiments are a part of the embodiments of the present disclosure, but not all of the embodiments of the present disclosure. Based on the described embodiments of the present disclosure, all other embodiments obtained by those skilled in the art without creative work are within the protection scope of the present disclosure. It should be noted that throughout the drawings, the same elements are indicated by the same or similar reference numerals. In the following description, some specific embodiments are only used for descriptive purposes, and should not be construed as having any limitation on the present disclosure, but are merely examples of the embodiments of the present disclosure. When it may cause confusion in the understanding of the present disclosure, conventional structures or configurations will be omitted. It should be noted that the shape and size of each component in the drawings do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The "first", "second" and similar words used in the embodiments of the present disclosure do not indicate any order, quantity, or importance, but are only used to distinguish different components.

In addition, in the description of the embodiments of the present disclosure, the term "connected" or "connected to" may refer to that two components are directly connected, or that two components are connected via one or more other components. In addition, the two components may be connected or coupled by manners of wired or wireless.

FIG. 1 illustrates a schematic view of a display area of a display substrate according to the embodiments of the present disclosure.

As shown in FIG. 1, the display substrate 100 includes a base substrate 110 and a plurality of sub-pixels Px1. The base substrate 110 includes a display area AA and a peripheral area PA surrounding the display area AA. The plurality of sub-pixels Px1 are located in the display area AA. A plurality of data lines DATA are also disposed in the display area AA. The plurality of data lines DATA are arranged in a first direction (x direction in FIG. 1) and extend in a second direction (y direction in FIG. 1), and the plurality of data lines DATA are connected to the plurality of sub-pixels Px1. A plurality of gate lines GATE are also disposed in the display area AA, the plurality of gate lines GATE extend in the x direction and are arranged in the y direction. In FIG. 1, each gate line GATE is connected to at least one row of sub-pixels Px1, and each data line DATA is connected to at least one column of sub-pixels Px1. During working, a gate driving signal of the gate line GATE turns on one row of sub-pixels connected to the gate line GATE, a data signal of the data line DATA connected to the one row of sub-pixels are respectively input to the one row of sub-pixels Px1, so that the one row of sub-pixels emit light.

Although the above description is given by taking as an example that each data line is connected to one column of sub-pixels and each gate line is connected to one row of sub-pixels, the embodiments of the present disclosure are not limited thereto. The data lines and the gate lines may be connected to respective sub-pixels in any other way as required, for example, each gate line is connected to two or more rows of sub-pixels, or each data line is connected to two or more columns of sub-pixels, and so on.

Figure 2:
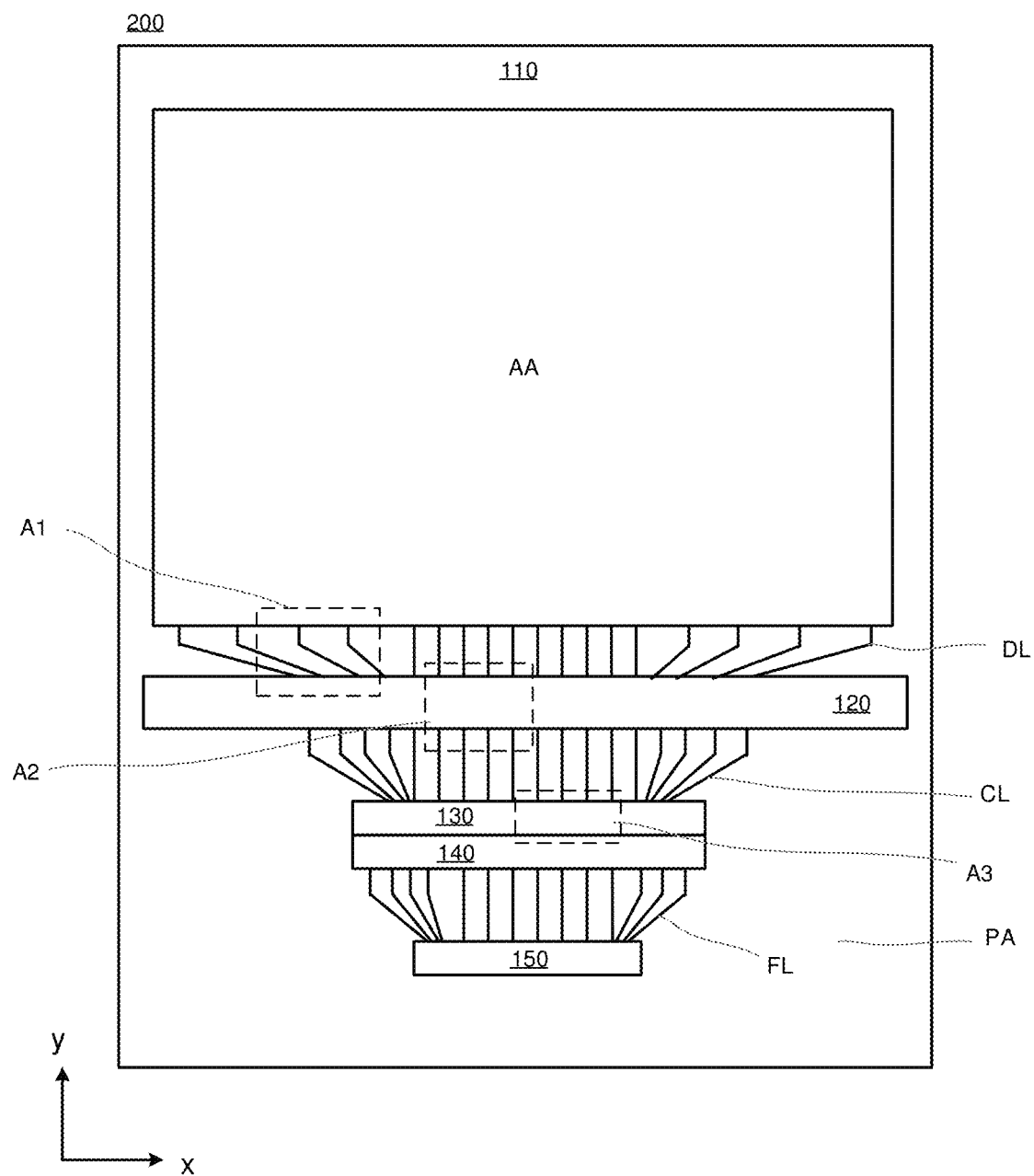
FIG. 2 illustrates a schematic plan view of a display substrate according to an embodiment of the present disclosure.

FIG. 2 illustrates a schematic plan view of a display substrate according to an embodiment of the present disclosure. As shown in FIG. 2, the display substrate 200 includes a base substrate 110, and the above description of the base substrate 110 is also applicable to the base substrate 110 in FIG. 2. A plurality of data wirings DL are disposed in a peripheral area PA of the base substrate 110. The plurality data wirings DL are located on a side of a display area AA in the y direction, and the plurality of data wirings DL are respectively connected with the plurality of data lines DATA in the display area AA.

In some embodiments, a bending area 120 is disposed in the peripheral area PA. The bending area 120 is located on a side of the plurality of data wirings DL away from the display area AA in the y direction. A plurality of patterned wirings may be disposed in the bending area 120. The plurality of patterned wirings are correspondingly connected to the plurality of data wirings, which will be described in further detail below.

In some embodiments, a plurality of connecting wirings CL may also be disposed in the peripheral area PA. The plurality of connecting wirings CL are located on a side of the bending area 120 away from the display area in the y direction, and the plurality of connecting wirings are correspondingly connected to the plurality of patterned wirings in the bending area 120, which will be described in further detail below.

In some embodiments, an auxiliary circuit may also be disposed in the peripheral area PA. The auxiliary circuit includes, but is not limited to, an electrostatic discharging circuit 130 and a unit testing circuit 140. As shown in FIG. 2, the electrostatic discharging circuit 130 is located on a side of the plurality of connecting wirings CL away from the display area AA in the y direction, and the unit testing circuit 140 is located on a side of the electrostatic discharging circuit 130 away from the display area AA in the y direction. Each connecting wiring CL has one end being connected to the patterned wirings in the bending area 120, and other end being connected to at least one of the electrostatic discharging circuit 130 and the unit testing circuit 140. The electrostatic discharging circuit 130 is configured to discharge electrostatic on the connecting wirings CL. The unit testing circuit 140 is configured to test sub-pixels in the display area AA through the connecting wirings CL and the data wirings DL. In some embodiments, the electrostatic discharging circuit 130 may include a plurality of electrostatic discharging units. The plurality of electrostatic discharging units are connected to the plurality of connecting wirings CL in one-to-one correspondence. Similarly, in some embodiments, the unit testing circuit 140 may include a plurality of unit testing sub-circuits which are also connected to the plurality of connecting wirings CL in one-to-one correspondence.

In some embodiments, a plurality of pins (located in an area represented by a box 150 in FIG. 2) may also be disposed in the peripheral area PA. The plurality of pins in the area 150 are respectively connected to the auxiliary circuit, e.g. at least one of the electrostatic discharging circuit 130 and the unit testing circuit 140, through a plurality of pin wirings FL. The plurality of pins in area 150 may be connected to pins on driver IC, so that a data signal provided by the driving IC may be provided to the sub-pixels in the display area AA through the pin wirings FL, the connecting wirings CL and the data wirings DL.

Figure 3:
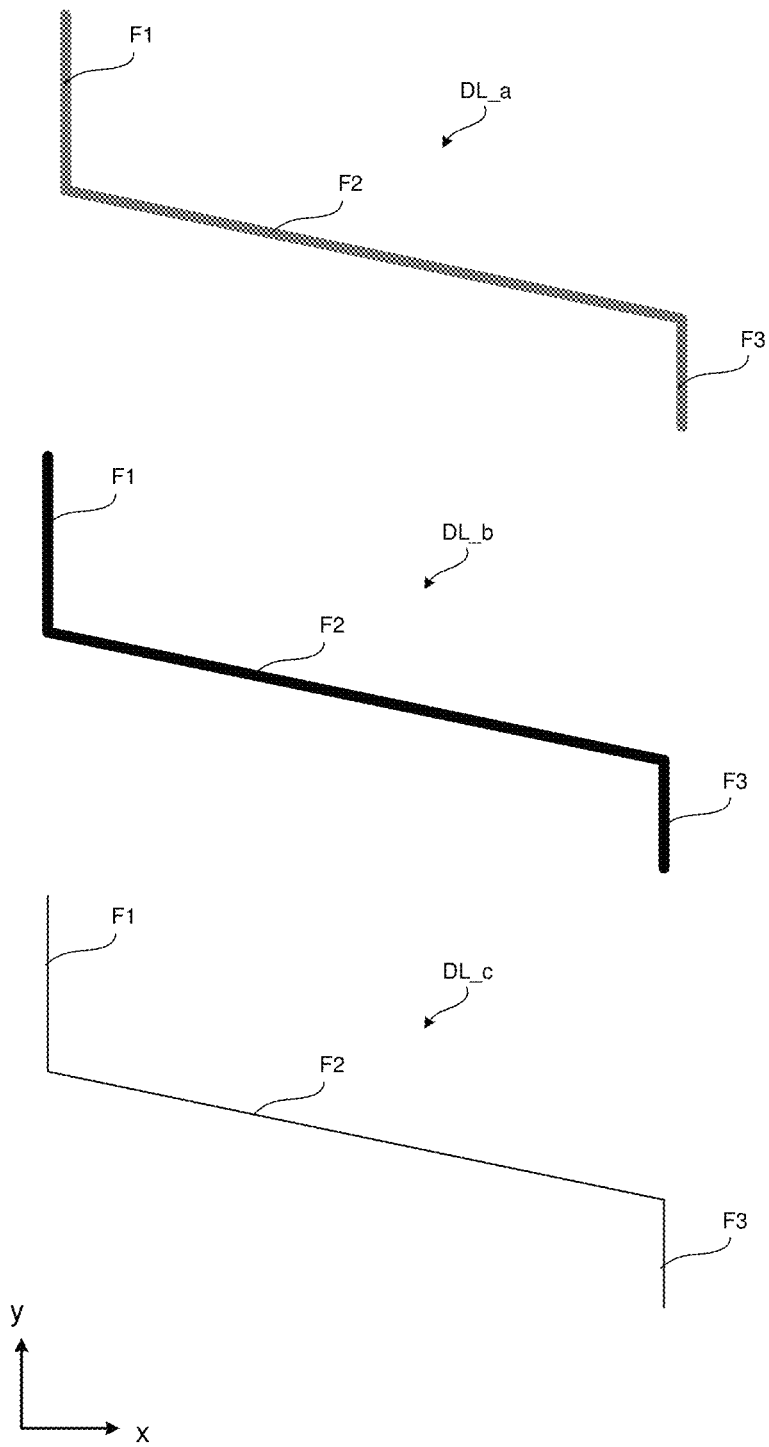
FIG. 3 illustrates a schematic view of the data wirings according to the embodiments of the present disclosure.

FIG. 3 illustrates a schematic view of data wirings according to the embodiments of the present disclosure.

As shown in FIG. 3, a plurality of data wirings DL include a first data wiring DL_a, a second data wiring DL_b and a third data wiring DL_c. The first data wiring DL_a is located in a first conductor layer, the second data wiring DL_b is located in a second conductor layer, the third data wiring DL_C is located in a third conductor layer. In order to distinguish three different conductor layers in FIG. 3, the first data wiring DL_a in the first conductor layer is represented by a thick gray line, the second data wiring DL_b in the second conductor layer is represented by a thick black line, and the third data wiring DL_c in the third conductor layer is represented by a thin black line. Those skilled in the art should understand that different thicknesses of the lines representing the first data wiring DL_a, the second data wiring DL_b and the third data wiring DL_c in FIG. 3 are only used to distinguish different data lines, and not intended to limit the actual line width of the data wirings.

Each of the first data wiring DL_a, the second data wiring DL_b and the third data wiring DL_c includes a first sub-data-wiring F1, a second sub-data-wiring F2 and a third sub-data-wiring F3. The first sub-data-wiring F1 and the third sub-data-wiring F3 extend in the y direction, the second sub-data-wiring F2 extends at a certain angle with respect to the y direction. The second sub-data-wiring F2 is connected between the first sub-data-wiring F1 and the third sub-data-wiring F3. For different data wirings, the angle of the second sub-data-wiring F2 with respect to the y direction may be different. Although the second sub-data-wiring F2 in FIG. 3 is drawn as a straight line, the embodiment of the present disclosure is not limited thereto. In practice, the second sub-data-wiring F2 may be designed to have a curved shape as required.

In combination with FIGS. 1 and 2, the first sub-data-wiring F1 is connected to at least one data line DATA in the display area AA, and the third sub-data-wiring F3 is connected to at least one patterned wiring in the bending area 120, which will be described in further detail below.

Figure 4:
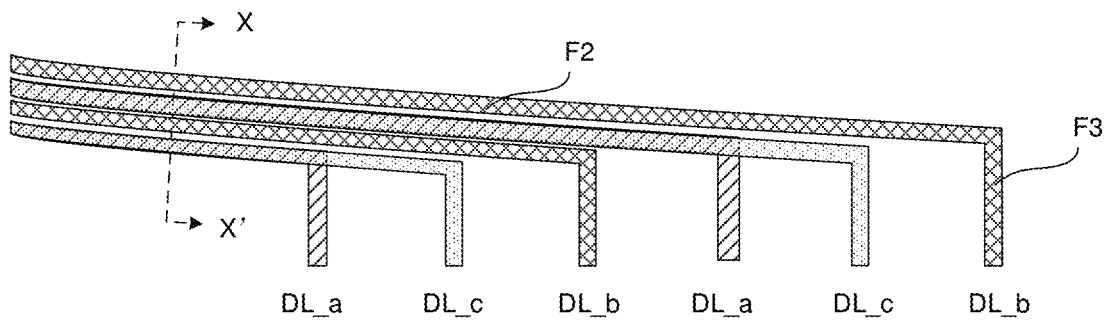
FIG. 4 illustrates a schematic view of area A1 in FIG. 2.
Figure 5:
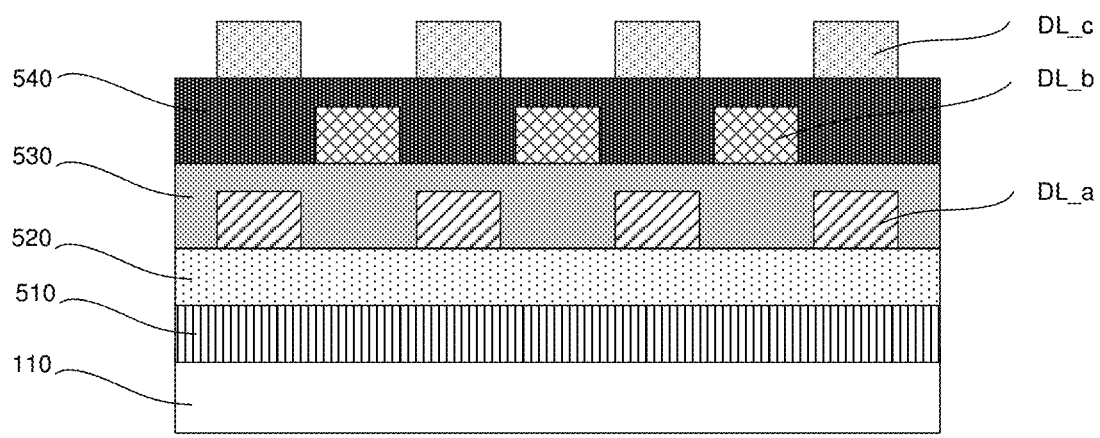
FIG. 5 illustrates a cross-sectional view along line X-X' in FIG. 4.

FIG. 4 illustrates a schematic view of area A1 in FIG. 2.
FIG. 5 illustrates a cross-sectional view along line X-X' in FIG. 4.

As shown in FIGS. 4 and 5, a first data wiring DL_a, a second data wiring DL_b and a third data wiring DL_c are arranged periodically. The first data wiring DL_a is located in a first conductor layer, and the first conductor layer is located on a side of the base substrate 110 facing the sub-pixels. The second data wiring DL_b is located in a second conductor layer, and the second conductor layer is located on a side of the first conductor layer where the first data wiring DL_a is located away from the base substrate 110. The third data wiring DL_c is located in a third conductor layer, and the third conductor layer is located on a side of the second conductor layer where the second data wiring DL_b is located away from the base substrate 110. In some embodiments, the first conductive layer may be disposed in the same layer as gate electrodes of thin film transistors of the sub-pixels, the second conductor layer may be disposed in the same layer as second electrodes of capacitors of the sub-pixels, and the third conductor layer may be disposed in the same layer as the layer where source electrodes and/or drain electrodes of thin film transistors of the sub-pixels are disposed, which will be described in further detail below. The materials of the first conductor layer and the second conductor layer include but are not limited to Mo. The material of the third conductor layer includes but is not limited to at least one of Ti or Al, for example, the third conductor layer may be disposed in a three-layer structure of Ti—Al—Ti.

The display substrate further includes a buffer layer 510, a first gate insulating layer 520, a second gate insulating layer 530 and an interlayer dielectric layer 540. The buffer layer 510 is located on a side of the base substrate 110 facing the sub-pixels. The first gate insulating layer 520 is located on a side of the buffer layer 510 away from the base substrate 110. The first data wiring DL_a is located on a side of the first gate insulating layer 520 away from the base substrate 110, and the first data wiring DL_a is covered by the second gate insulating layer 530. The second data wiring DL_b is located on a side of the second gate insulating layer 530 away from the base substrate 110, and the second data wiring DL_b is covered by the interlayer dielectric layer 540. The third data wiring DL_c is located on a side of the interlayer dielectric layer 540 away from the base substrate 110.

As shown in FIGS. 4 and 5, an orthographic projection of a part of at least one first data wiring DL_a on the base substrate 110 overlaps with an orthographic projection of a part of at least one third data wiring DL_c on the base substrate 110. For example, an orthographic projection of a second sub-data-wiring F2 of the first data wiring DL_a on the base substrate 110 at least partially overlaps with an orthographic projection of a second sub-data-wiring F2 of the third data wiring DL_c on the base substrate 110, for example, a central axis of the second sub-data-wiring F2 of the first data wiring DL_a and a central axis of the second sub-data-wiring F2 of the third data wiring DL_c coincide.

The central axis of the wiring here may refer to a central axis in an extending direction of the wiring, and a distance between the central axis and an edge on one side of the wiring is equal to a distance between the central axis and an edge on the other side of the wiring. An orthographic projection of a second sub-data-wiring F2 of the second data wiring DL_b on the base substrate 110 may not overlap with each of the orthographic projection of the second sub-data-wiring F2 of the first data wiring DL_a on the base substrate 110 and the orthographic projection of the second sub-data-wiring F2 of the third data wiring DL_c on the base substrate 110.

In the embodiments shown in FIGS. 4 and 5, a width of the first data wiring DL_a is same as a width of the third data wiring DL_c, the width here may refer to a dimension perpendicular to the extending direction of the wiring. However, the embodiments of the present disclosure are not limited to this. In some embodiments, the width of the third data wiring DL_c may be decreased as much as possible, while the width of the first data wiring DL_a and a width of the second data wiring DL_b are increased as much as possible. For example, the line width of the third data wiring DL_c may be 1.8 μm±α, the width of the first data wiring DL_a and the width of the second data wiring DL_b may be 2.2 μm±α, wherein a represents the allowable error.

According to the embodiments of the present disclosure, by disposing the data wirings DL in three different conductor layers, the orthographic projection of the data wirings in the first conductor layer on the base substrate at least partially overlaps with the orthographic projection of the data wirings in the third conductor layer on the base substrate, so as to reduce the space occupied by the data wirings. For example, compared with the traditional non-overlapping structure, the overall space occupied by the second sub-data-wiring F2 may be reduced by ⅓. In addition, a plurality of dielectric layers, such as the first gate insulating layer 530 and the interlayer dielectric layer 540, may be disposed between the first conductor layer and the third conductor layer. The existence of the dielectric layers may reduce the mutual crosstalk between the data wirings on the first conductor layer and the data wirings on the third conductor layer.

Figure 6:
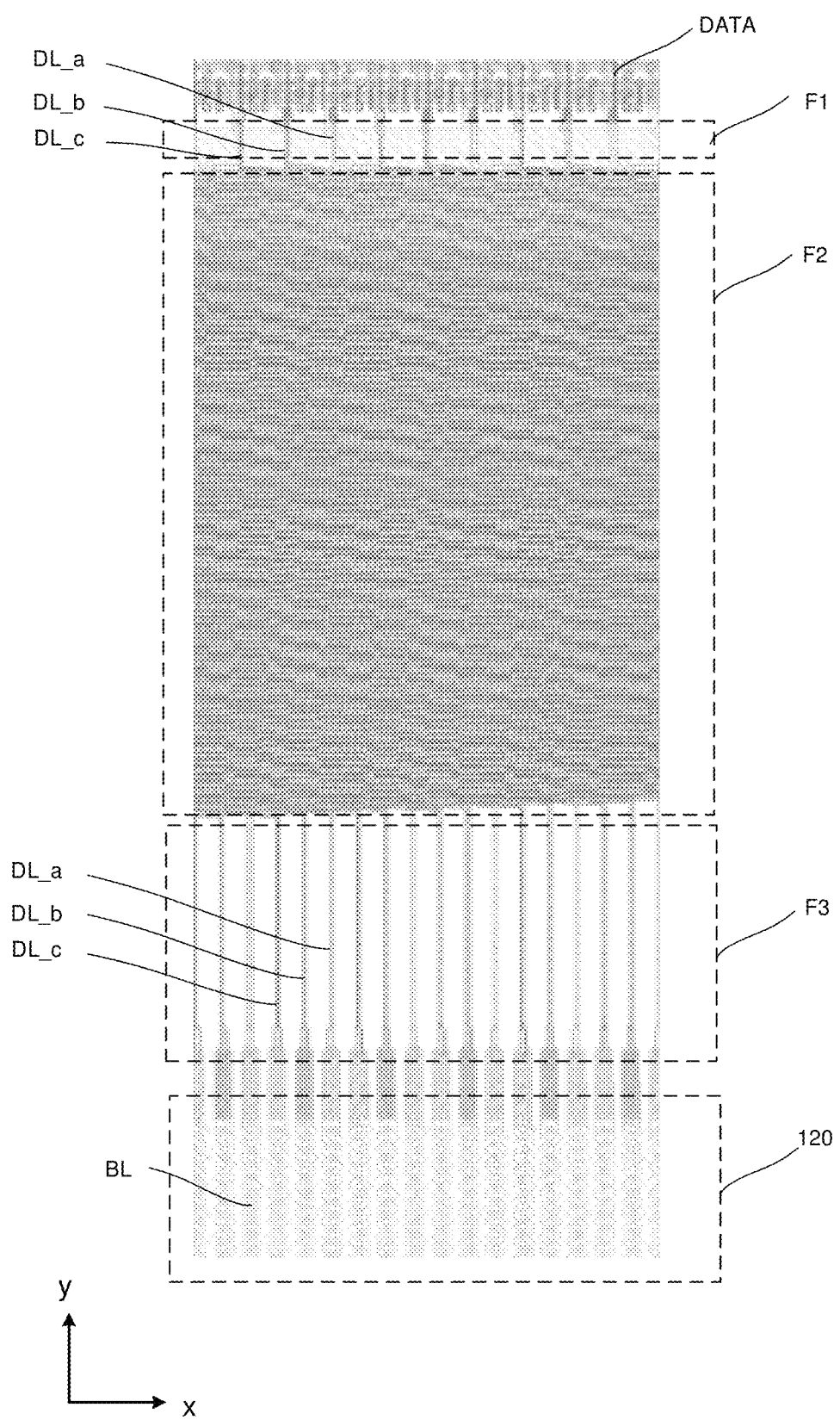
FIG. 6 illustrates a layout view of the area A1 in FIG. 2.

FIG. 6 illustrates a layout view of the area A1 in FIG. 2. As shown in FIG. 6, the plurality of patterned wirings BL are disposed in the bending area 120. In any one of the first data wiring DL_a, the second data wiring DL_b and the third data wiring DL_c, the first sub-data-wiring F1 and the third sub-data-wiring F3 extend in the y direction, an extension direction of the second sub-data-wiring F2 is at a certain angle with respect to the first sub-data-wiring F1 and the third sub-data-wiring F3, the first sub-data-wiring F1 is connected to at least one data line DATA in the display area AA, and the third sub-data-wiring F3 is connected to at least one patterned wiring BL in the bending area 120.

Figure 7:
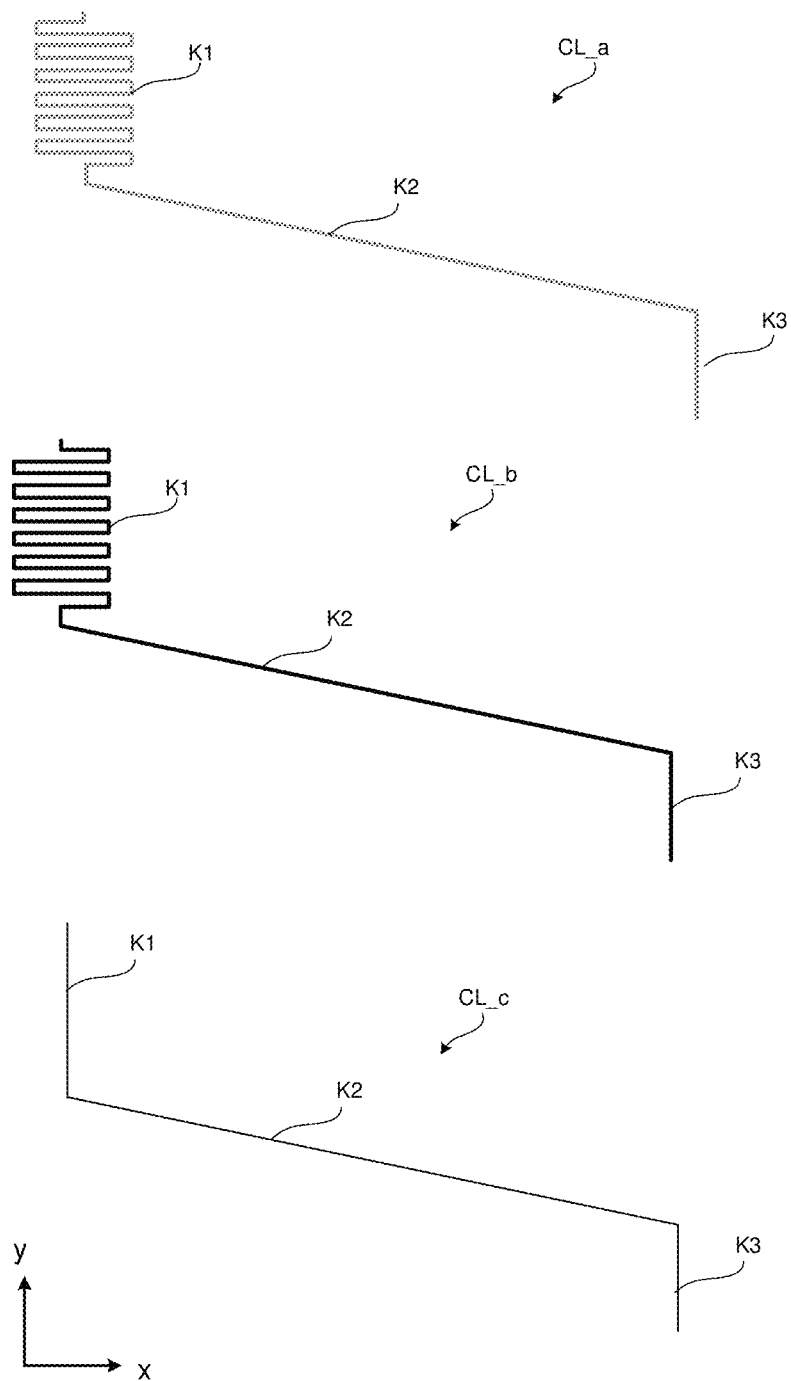
FIG. 7 illustrates a schematic view of the connecting wirings according to the embodiments of the present disclosure.

FIG. 7 illustrates a schematic view of connecting wirings according to the embodiments of the present disclosure.

As shown in FIG. 7, a plurality of connecting wirings CL include a first connecting wiring CL_a, a second connecting wiring CL_b and a third connecting wiring CL_c. The first connecting trace CL_a is located in a first conductor layer, the second connecting wiring CL_b is located in a second conductor layer, and the third connecting wiring CL_C is located in a third conductor layer. Similar to FIG. 3, in FIG. 7 the first connecting wiring CL_a in the first conductor layer is represented by a thick gray line, the second connecting wiring CL_b in the second conductor layer is represented by a thick black line, and the third connecting wiring CL_c in the third conductor layer is represented by a thin black line. Each of the first connecting wiring CL_a, the second connecting wiring CL_b and the third connecting wiring CL_c includes a first sub-connecting-wiring K1 and a second sub-connecting-wiring. In some embodiments, each of the first connecting wiring CL_a, the second connecting wiring CL_b and the third connecting wiring CL_c may further include a third sub-connecting-wiring K3. The first sub-connecting-wiring K1 and the third sub-connecting-wiring K3 extend in the y direction, and the second sub-connecting-wiring K2 extends at a certain angle with respect to the y direction. The second sub-connecting-wiring K2 is connected between the first sub-connecting-wiring K1 and the third sub-connecting-wiring K3. For different connecting wirings, the angle of second sub-connecting-wiring with respect to the y direction may be different. Although the second sub-connecting-wiring K2 in FIG. 7 is drawn as a straight line, the embodiments of the present disclosure is not limited thereto. In practice, the second sub-connecting-wiring K2 may be designed in a curved shape as required.

Figure 8:
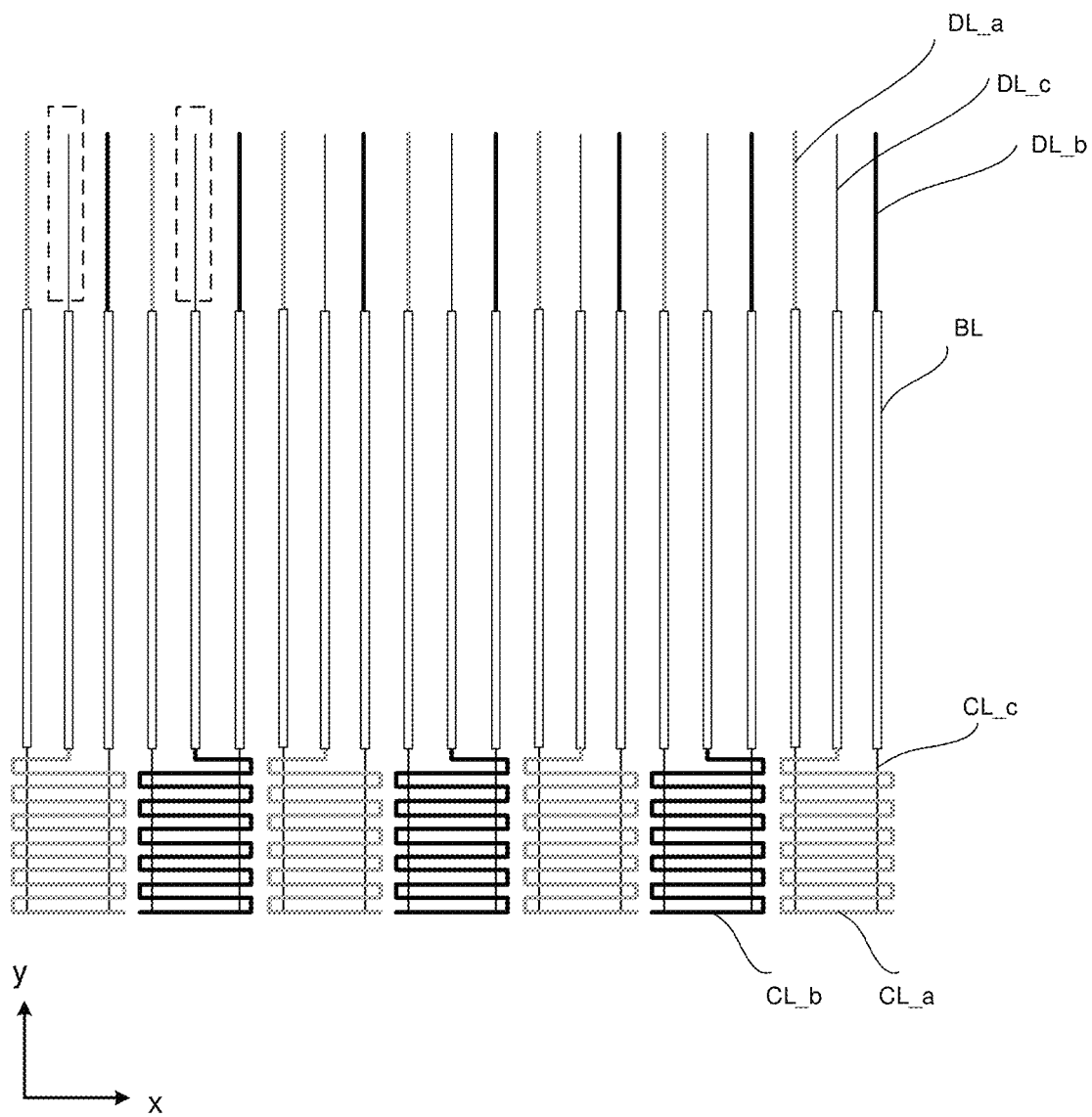
FIG. 8 illustrates a schematic view of area A2 in FIG. 2.
Figure 9:
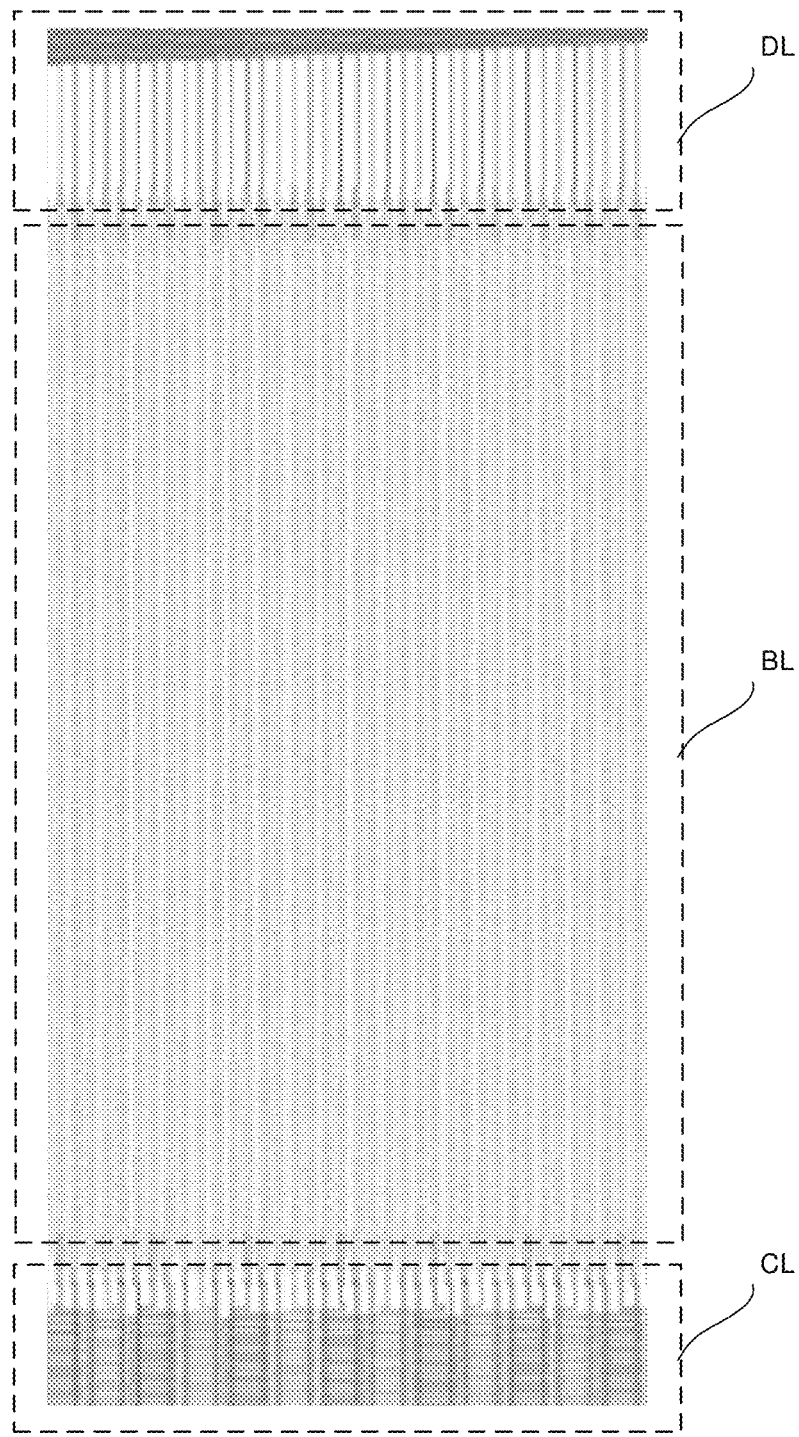
FIG. 9 illustrates a layout view of the area A2 in FIG. 2.

FIG. 8 illustrates a schematic view of area A2 in FIG. 2. FIG. 9 illustrates a layout view of the area A2 in FIG. 2.

As shown in FIGS. 8 and 9, the plurality of data wirings DL (including the first data wiring DL_a, the second data wiring DL_b and the third data wiring DL_c) may be connected to the plurality of patterned wirings BL in one-to-one correspondence, and the plurality of patterned wirings BL may be connected to the plurality of connecting wirings CL (including a first connecting wiring CL_a, a second connecting wiring CL_b and a third connecting wiring CL_c) in one-to-one correspondence. The first connecting wiring CL_a, the second connecting wiring CL_b and the third connecting wiring CL_c are arranged periodically, so that, for example, each first data wiring DL_a is connected to one third connecting wiring CL_c through one patterned wiring BL, each second data wiring DL_b is connected to one third connecting wiring DL_c through one patterned wiring BL, and each third data wiring DL_c is connected to one first connecting wiring CL_a or one second connecting wiring CL_b through one patterned wiring BL.

In some embodiments, as shown in FIGS. 8 and 9, the third sub-data-wiring F3 is periodically arranged in the order of DL_a, DL_c and DL_b, and the connecting wirings are periodically arranged in the order of CL_c, CL_a, CL_c, CL_c, CL_b, CL_c. In any two adjacent third data wirings DL_c (for example, two adjacent third data wirings DL_c shown by the dashed box in FIG. 8), one third data wiring DL_c is connected to the first connecting wiring CL_a, the other one third data wiring DL_c is connected to the second connecting wiring CL_b. The two adjacent third data wirings here refer to two third data wirings of a plurality of third data wirings that are closest to each other in the y direction, for example, two third data wirings DL_c shown by the dashed frame in FIG. 8.

Figure 10:
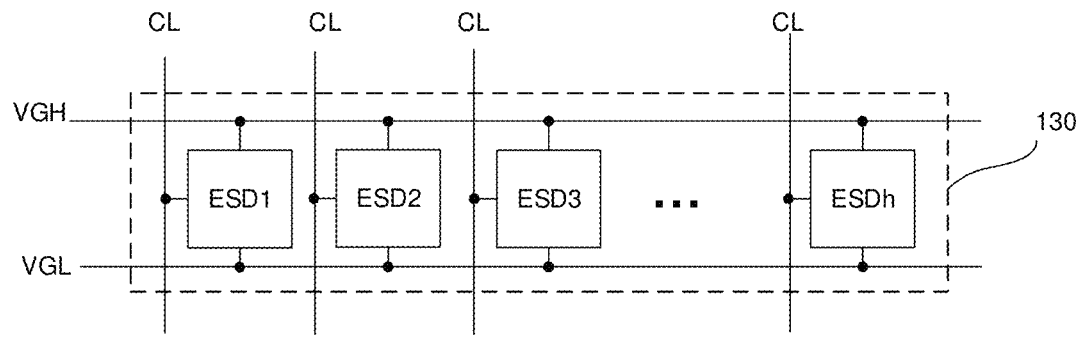
FIG. 10 illustrates a schematic view of an electrostatic discharging circuit according to the embodiments of the present disclosure.
Figure 11:
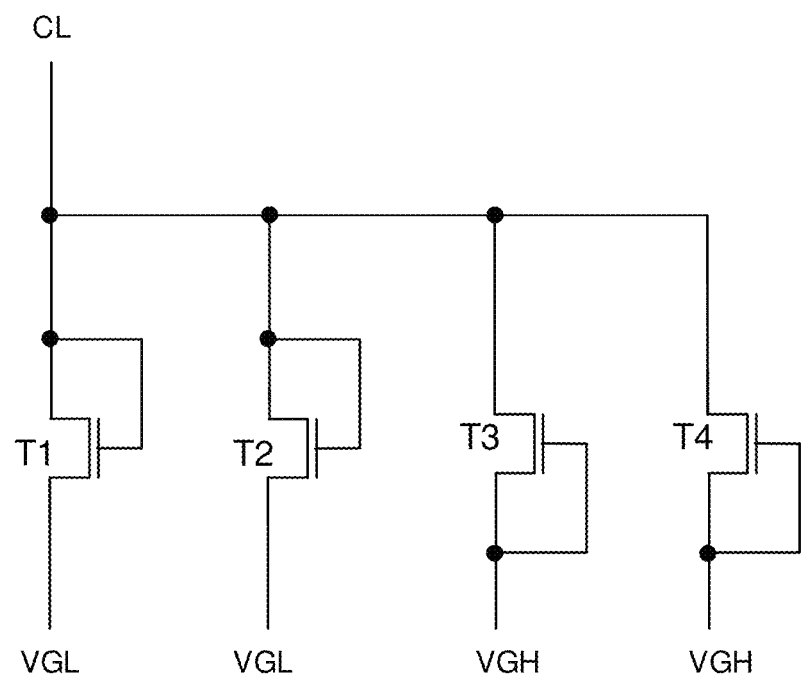
FIG. 11 illustrates a circuit diagram of an electrostatic discharging unit of an electrostatic discharging circuit according to the embodiments of the present disclosure.

FIG. 10 illustrates a schematic view of an electrostatic discharging circuit according to the embodiments of the present disclosure. FIG. 11 illustrates a circuit diagram of an electrostatic discharging unit of an electrostatic discharging circuit according to the embodiments of the present disclosure.

As shown in FIG. 10, the electrostatic discharging circuit 130 in FIG. 2 is connected to a plurality of connecting wirings CL. The electrostatic discharging circuit 130 may include a plurality of electrostatic discharging units ESD1, ESD2, . . . , ESDh. The plurality of electrostatic discharging units ESD1, ESD2, . . . , ESDh are connected to a plurality connecting wirings CL in one-to-one correspondence.

As shown in FIG. 11, each of electrostatic discharging units ESD1, ESD2, . . . , ESDh includes a first transistor T1, a second transistor T2, a third transistor T3 and a fourth transistor T4. A gate electrode and a first electrode of the first transistor T1, a gate electrode and a first electrode the second transistor T2, a second electrode of the third transistor T3 and a second electrode the fourth transistor T4 are connected to one corresponding connecting wiring CL, a second electrode of the first transistor T1 and a second electrode of the second transistor T2 are connected to a low voltage signal line VGL, and a gate electrode and a first electrodes of the third transistor T3 and a gate electrode and a first electrodes of the fourth transistor T4 are connected to a high voltage signal line VGH.

The transistors T1 to T4 may all be P-type transistors. When a high level of signal on the connecting wirings CL is higher than the value of preset high level, at least one of the third transistor T3 or the fourth transistor T4 is turned on and the connecting wirings CL may control the potential of the high voltage signal line VGH, so that the high level is released through at least one of the third transistor T3 or the fourth transistor T4. When a low level of signal on the connecting wirings CL is lower than the value of preset low level, at least one of the first transistor T1 or the second transistor T2 is turned on and the connecting wirings CL may control the potential of the low voltage signal line VGL, so that the low level is released through at least one of the first transistor T1 or the second transistor T2.

Although the electrostatic discharging unit in FIG. 11 has a specific circuit structure, the embodiments of the present disclosure are not limited thereto. The electrostatic discharging unit may include other circuit structures as required, for example, including more or fewer transistors, or any number of transistors connected in other ways.

Figure 12A:
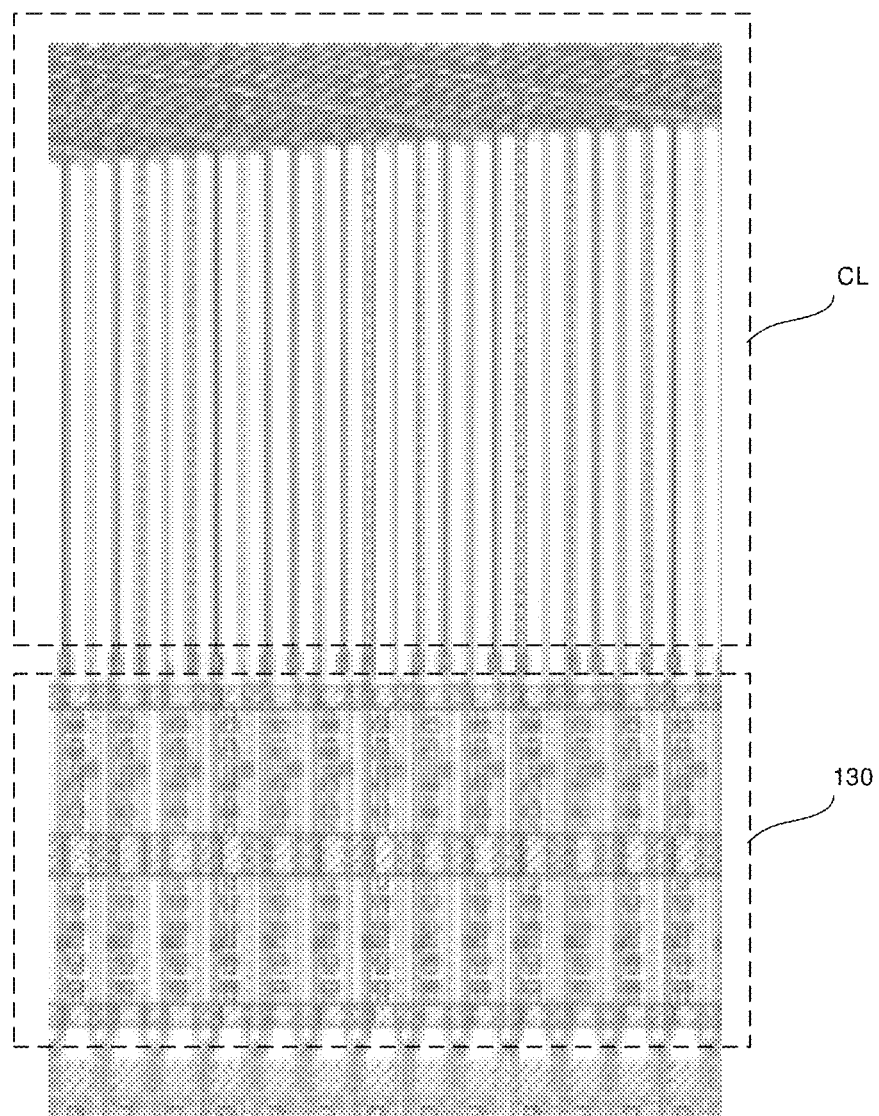
FIG. 12A illustrates a layout view of area A3 in FIG. 2.
Figure 12B:
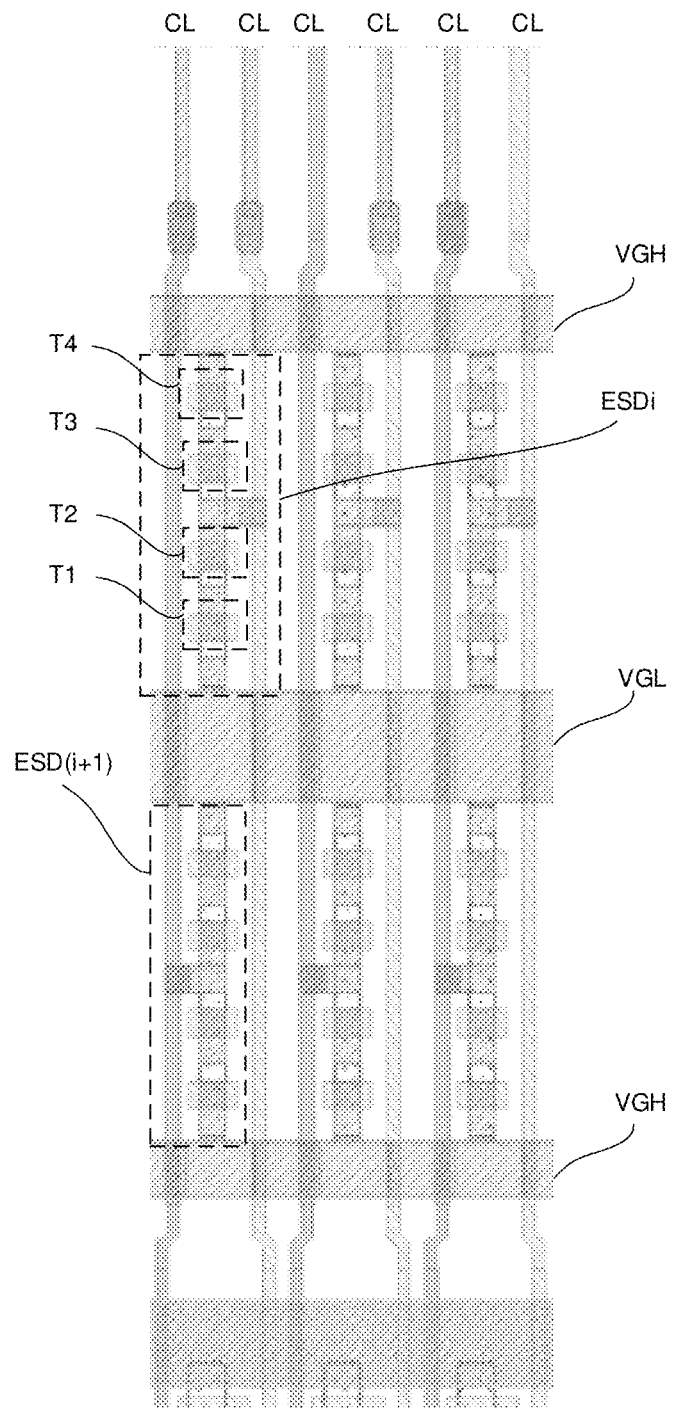
FIG. 12B illustrates a partial enlarged view of an electrostatic discharging circuit in FIG. 12A.

FIG. 12A illustrates a layout view of area A3 in FIG. 2. FIG. 12B illustrates a partial enlarged view of an electrostatic discharging circuit 130 in FIG. 12A.

As shown in FIGS. 12A and 12B, the electrostatic discharging circuit 130 may include a plurality of electrostatic discharging units ESD1, ESD2, . . . , ESDh. For brevity, only two of the electrostatic discharging units ESDi and ESD(i+1) are marked in FIG. 12B. The plurality of electrostatic discharging units ESD1, ESD2, . . . , ESDh are connected to the plurality of connecting wirings CL in one-to-one correspondence. Each of the electrostatic discharging units ESD1, ESD2, . . . , ESDh includes a first transistor T1, a second transistor T2, a third transistor T3 and a fourth transistor T4. The difference from the circuit structure of the electrostatic discharging unit shown in FIG. 11 is that, in FIG. 12B, the first transistor T1 and the second transistor T2 are connected in series between the connecting wirings CL and a low-voltage signal line VGL, and the third transistor T3 and the fourth transistor T4 are connected in series between the connecting wirings CL and a high voltage signal line VGH.

Figure 13:
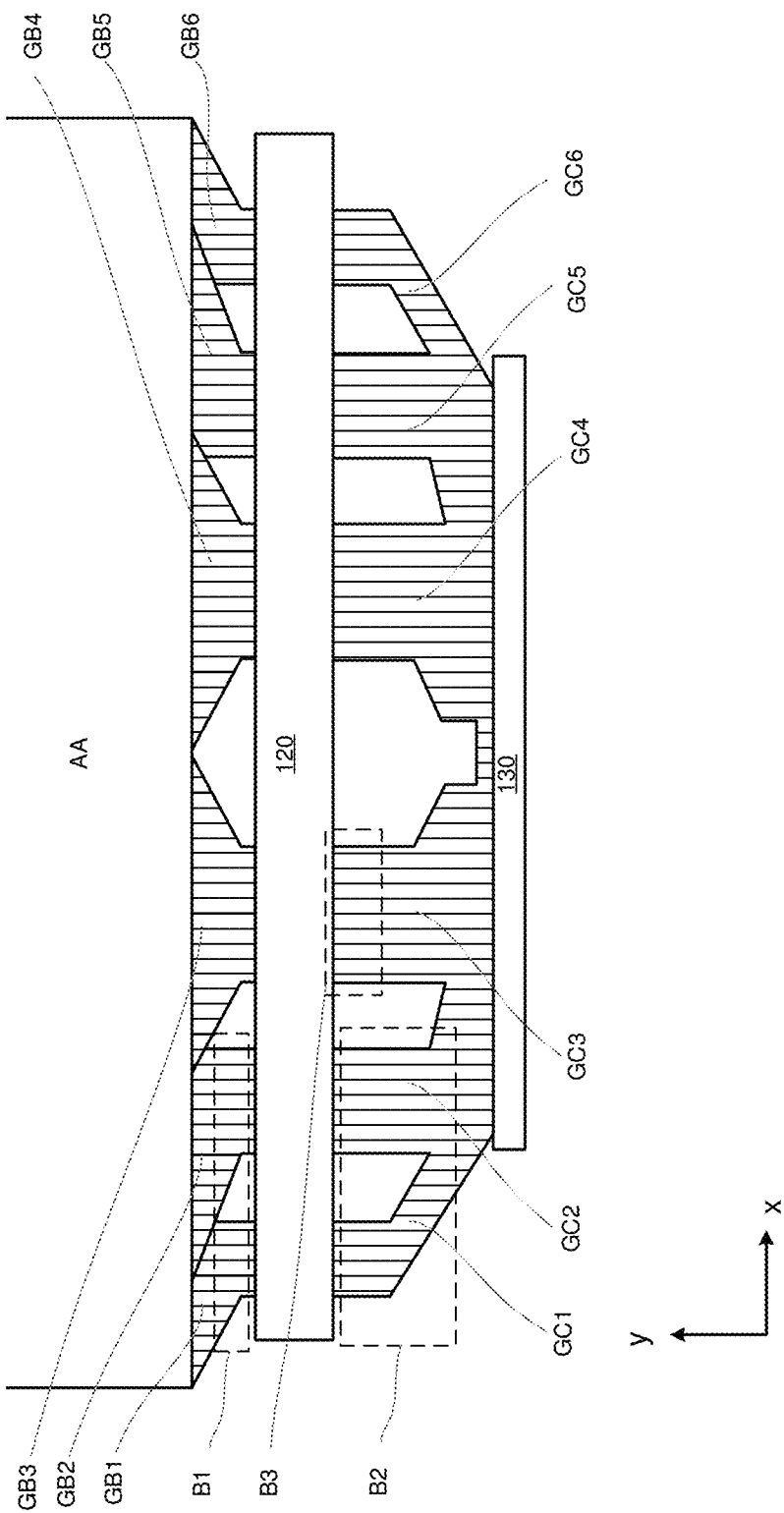
FIG. 13 illustrates a schematic plan view of a display substrate according to another embodiment of the present disclosure.

FIG. 13 illustrates a schematic plan view of a display substrate according to another embodiment of the present disclosure. The display substrate of FIG. 13 is similar to the display substrate of FIG. 2, the difference is at least that data wirings DL and connecting wirings CL are divided into a plurality of sets.

In FIG. 13, a plurality of data wirings DL are divided into a plurality of sets, which from left to right in the x direction are a first set of data wirings GB1, a second set of data wirings GB2, a third set of data wirings GB3, a fourth set of data wirings GB4, a fifth set of data wirings GB5 and a sixth set of data wirings GB6 (hereinafter collectively referred to as data wiring set GB). Taking a center line of the display substrate 110 in the y direction as a symmetry axis, the first set of data wirings GB1 and the sixth set of data wirings GB6 are symmetrical, the second set of data wirings GB2 and the fifth set of data wirings GB5 are symmetrical, and the third set of data wirings GB3 and the fourth set of data wirings GB4 are symmetrical, respectively. In a similar manner, a plurality connecting wirings CL are divided into a first set of connecting wirings GC1 to a sixth set of connecting wirings GC6 (hereinafter collectively referred to as connecting wiring set GC).

According to the embodiments of the present disclosure, a distance between adjacent two sets GB is greater than a distance between adjacent data wirings of the set GB, and a distance between adjacent two sets GC is greater than a distance between adjacent connecting wirings of the set GC, which will be described in detail below with reference to FIGS. 14 and 15.

Figure 14:
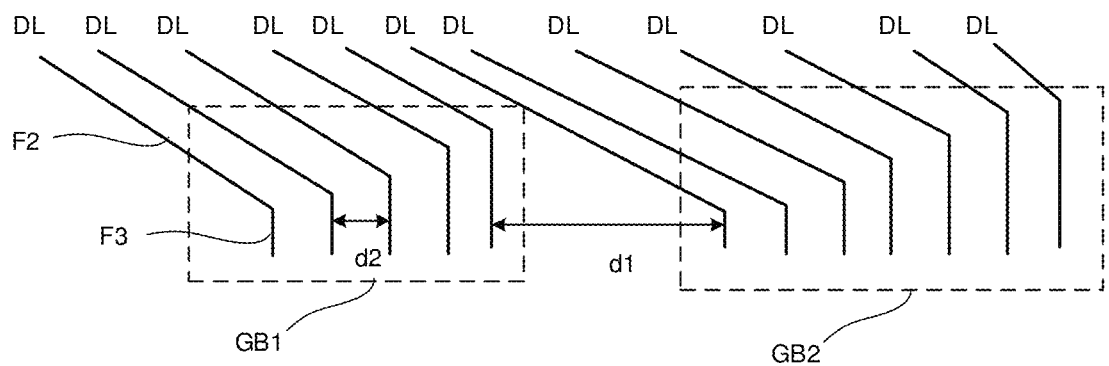
FIG. 14 illustrates a schematic view of area B1 in FIG. 13.

FIG. 14 illustrates a schematic view of area B1 in FIG. 13. FIG. 15 illustrates a schematic d of the area B2 in FIG. 13.

As shown in FIG. 14, third sub-data-wirings F3 of two data wirings DL that belong to the set GB1 and the set GB2 and are adjacent to each other are separated by a first distance d1 in the x direction (hereinafter also referred to as a distance between adjacent sets), third sub-data-wirings F3 of two data wirings DL that belong to the same set (for example, belong to the GB1 or the GB2) and are adjacent to each other is separated by a second distance d2, wherein the second distance d2 is smaller than the first distance d1. The distance between adjacent sets may be set as required. For example, the distance d1 between the set GB1 and the set GB2 may be equal to or different from a distance d1' between the set GB2 and the set GB3. In some embodiments, as shown in FIG. 13, a distance between the set GB3 and the set GB4 is greater than a distance between the set GB1 and the set GB2.

Figure 15:
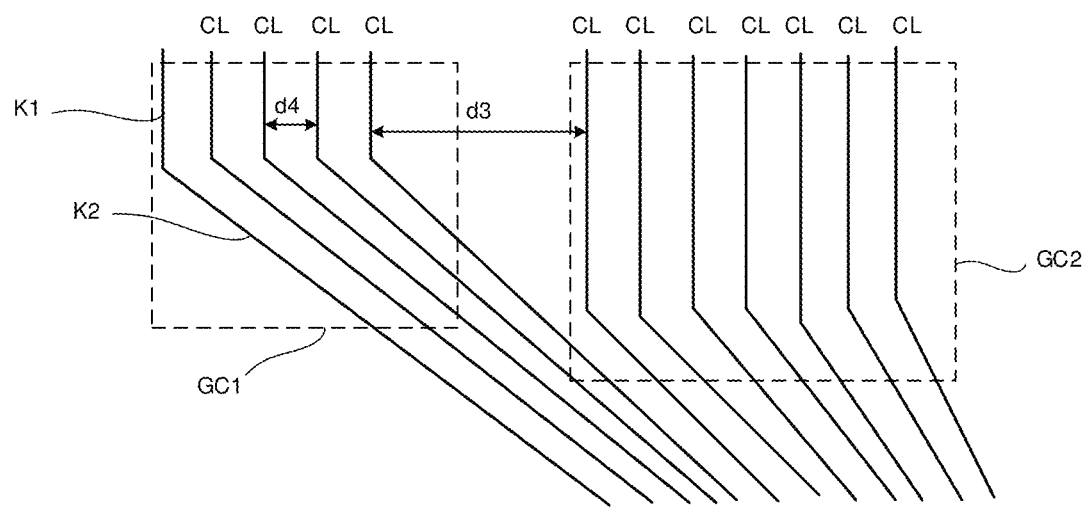
FIG. 15 illustrates a schematic view of area B2 in FIG. 13.

Similarly, as shown in FIG. 15, first sub-connecting-wirings K1 of two connecting wirings CL that belong to the set GC1 and the set GC2 and are adjacent to each other are separated by a third distance d3 in the x direction, first sub-connecting-wirings of two connecting wirings CL that belong to the same set (for example, belong to the GC1 or the GC2) and are adjacent to each other is separated by a fourth distance d4 in the x direction, wherein the fourth distance d4 is smaller than the third distance d3. In some embodiments, a distance between two adjacent sets of connecting wirings may be equal to a distance between two adjacent sets of data wirings connected to the two adjacent sets. For example, a distance d3 between the set GC1 and the set GC2 may be equal to the distance d1 between the set GB1 and the set GB2.

Figure 16:
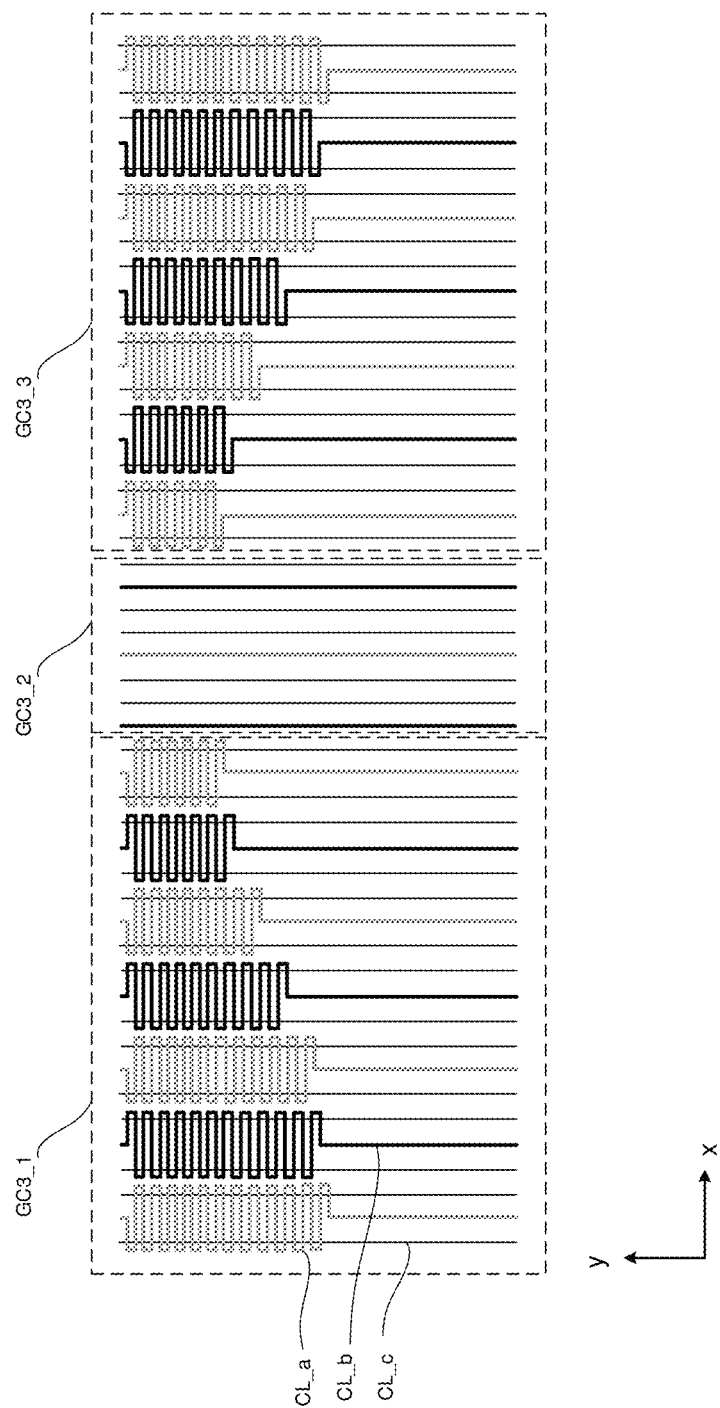
FIG. 16 illustrates a schematic view of area B3 in FIG. 13.
Figure 17:
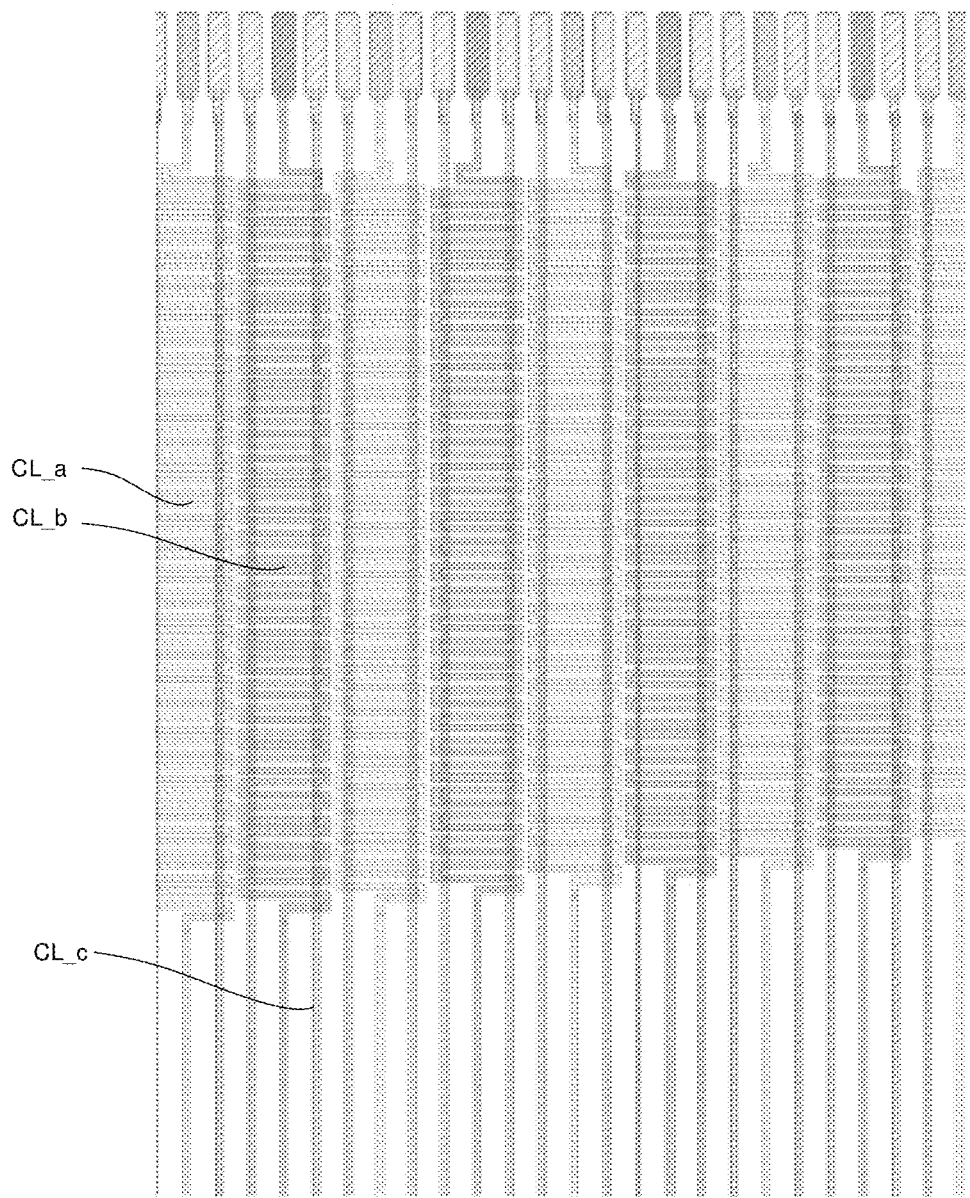
FIG. 17 illustrates a layout view of the area B3 in FIG. 13.

FIG. 16 illustrates a schematic view of area B3 in FIG. 13. FIG. 17 illustrates a layout view of the area B3 in FIG. 13.

As shown in FIGS. 16 and 17, the connecting wiring set GC3 in FIG. 13 may be divided into a first sub-set of connecting wirings GC3_1, a second sub-set of connecting wirings GC3_2 and a third sub-set of connecting wirings GC3_3. The first sub-set of connecting wirings GC3_1 and the third sub-set of connecting wirings GC3_3 are located on two sides of the second sub-set of connecting wirings GC3_2 in the x direction.

In the first sub-set of connecting wirings GC3_1 and the third sub-set of connecting wirings GC3_3, a first sub-connecting-wiring K1 of each of first connecting wiring CL_a and second connecting wiring CL_b extends to patterned wiring in a polyline shape. In the second sub-set of connecting wirings GC3_2, a first sub-connecting-wiring K1 of each connecting wiring (including CL_a, CL_b and CL_c) extends in a straight line.

In the first sub-set of connecting wirings GC3_1 and the third sub-set of connecting wirings GC3_3, a part extending in polyline shape may have different length for different connecting wirings. In some embodiments, lengths of the first set of data wirings GB3_1d electrically connected to the first sub-set of connecting wirings GC3_1 gradually decreases from left to right. Correspondingly, in the first sub-set of connecting wirings GC3_1, a part extending in polyline shape of each of the first connecting wiring CL_a and the second connecting wiring CL_b may have a length that gradually decreases from left to right (that is, in the x direction), so as to compensate for the change in the length of the data wiring connected thereto. For example, in FIG. 16, the length of the part extending in polyline shape of the first connecting wiring CL_a on far left is greater than the length of the part extending in polyline shape of the second connecting wiring CL_b on right side of the first connecting wiring CL_a, and so on.

Similarly, in the third sub-set of connecting wirings GC3_3, the part extending in polyline shape of the first sub-connecting-wiring K1 of each of the first connecting wiring CL_a and the second connecting wiring CL_b may have a length that gradually increase in the x direction, for example, the length of the part extending in polyline shape of the first connecting wiring CL_a on the far right is smaller than the length of the part extending in polyline shape of the second connecting wiring CL_b on left side of the first connecting wiring CL_a, and so on.

In FIG. 16, a pattern formed by each part of polyline shape extended of the first sub-set of connecting wirings GC3_1 is symmetrical to a pattern formed by each part of polyline extended of the third sub-set of connecting wirings GC3_3, that is, the slope at which the polyline shape extended parts of the first sub-set of connecting wirings decrease or increase is the same as the slope at which the polyline shape extended parts of the third sub-set of connecting wirings decrease or increase. However, the embodiments of the present disclosure are not limited thereto. In some embodiments, the lengths of the polyline shape extended parts of the first sub-set of connecting wiring GC3_1 decrease from left to right with a certain slope, and the lengths of the polyline shape extended parts of the third sub-set of connecting wirings GC3_3 increase from left to right with another slope smaller than the slope (depending on the length change of the data wirings connected to the third sub-set of connecting wirings GC3_3), so that the pattern formed by the first sub-set of connecting wirings GC3_1 and the third sub-set of connecting wirings GC3_3 is asymmetric. In other embodiments, none of the third sub-set of connecting wirings GC3_3 has a part of polyline shape extended.

The other sets of connecting wirings GC1, GC2, GC4, GC5 and GC6 have similar structures, and will not be repeated here.

Since materials of different conductor layers have different resistivities, wirings on different conductor layers may have different resistances when length of wirings is the same. For example, a resistivity of a material of the third conductor layer may be lower than a resistivity of a material of the first conductor layer and a resistivity of a material of the second conductor layer. In the embodiments of the present disclosure, a part of the connecting wirings in the first conductor layer and the second conductor layer are disposed in a polyline shape, a length of the connecting wirings may be increased to compensate for low resistance of data wirings connected to the connecting wirings. In this way, the resistance of the transmission path of each data signal may be substantially the same.

In some embodiments, the degree of gradual change of lengths of the polyline shape extended of the connecting wirings in different sets may be different, which will be described in detail below with reference to FIGS. 18A to 18C.

Figure 18A:
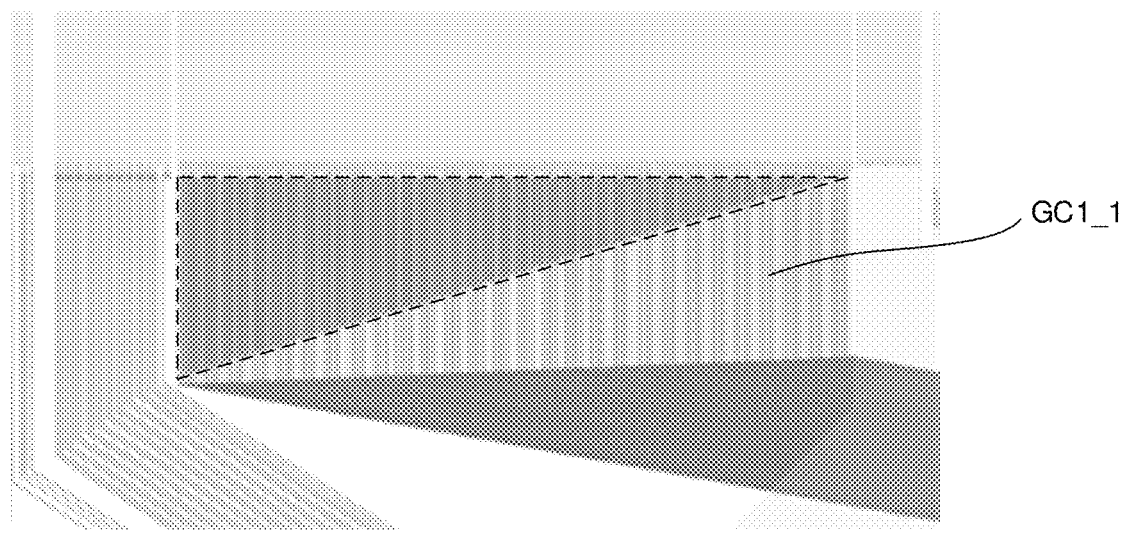
FIGS. 18A to 18C respectively illustrate layout views of first sub-set connecting wirings of sets GC1 to GC3.
Figure 18B:
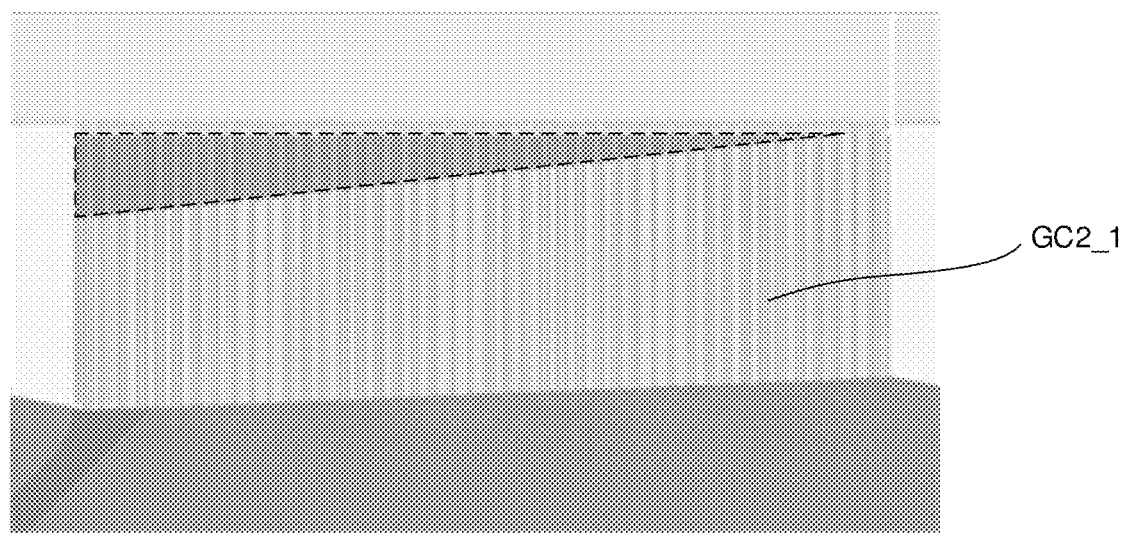
Figure 18C:

FIGS. 18A to 18C respectively illustrate a layout of first sub-sets of connecting wirings of the sets GC1 to GC3. Sets GC4 to GC6 and Sets GC1 to GC3 are set symmetrically, and will not be repeated here.

As shown in FIG. 18A, in the first sub-set GC1_1 of the set GC1, two adjacent parts extending in polyline shape have different lengths, so that the length of each part extending in polyline shape gradually decreases at a first slope, thereby forming a triangular pattern as shown by the dotted line. Similarly, as shown in FIG. 18B, in the first sub-set GC2_1 of the set GC2, a length of each part extending in polyline shape gradually decreases at a second slope, thereby forming a triangular pattern as shown by the dotted line. As shown in FIG. 18C, in the first sub-set GC3_1 of the set GC3, a length of each part extending in polyline shape gradually decreases at a third slope, thereby forming a triangular pattern as shown by the dotted line.

It may be seen from FIGS. 18A to 18C that the first slope is greater than the second slope, and the second slope is greater than the third slope, that is, a length difference between two adjacent parts extending in polyline shape in the set GC1 is greater than a length difference between adjacent parts extending in polyline shape in the set GC2, and the length difference between adjacent parts extending in polyline shape in the set GC2 is greater than a length difference between adjacent parts extending in polyline shape in the set GC3.

Figure 19:
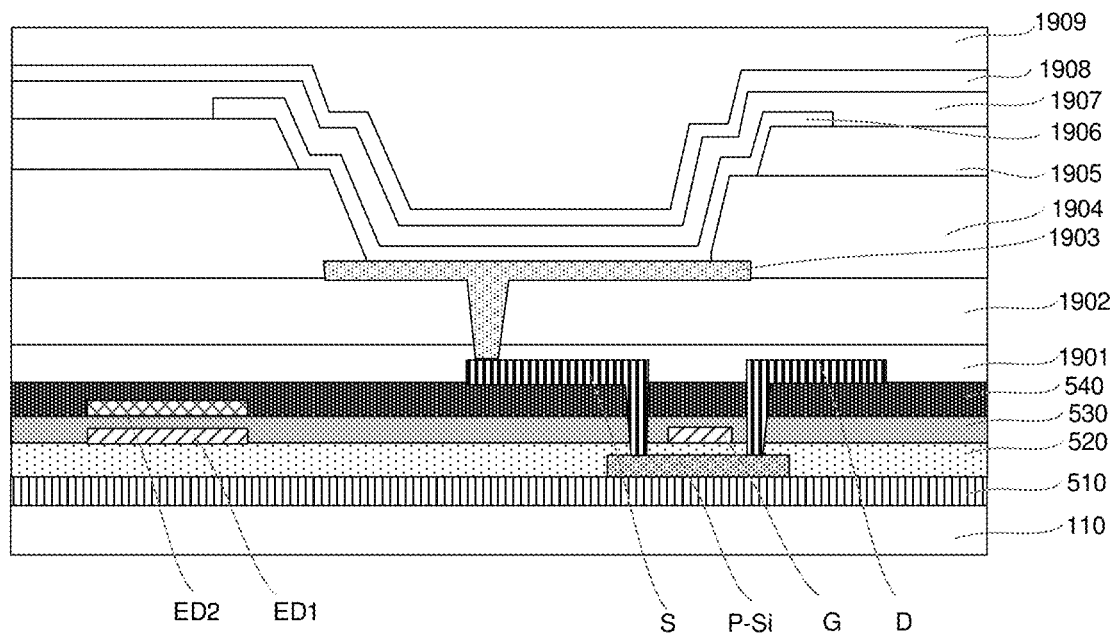
FIG. 19 illustrates a schematic view of a structure of a sub-pixel of a display substrate according to the embodiments of the present disclosure.

FIG. 19 illustrates a schematic view of a sub-pixel structure of a display substrate according to the embodiments of the present disclosure.

As shown in FIG. 19, at least one of a plurality of sub-pixels in the display substrate includes a thin film transistor and a capacitor, the thin film transistor includes a gate electrode G, a source electrode S and a drain electrode D, and the capacitor includes a first electrode ED1 and a second electrode ED2. An active layer P—Si of the thin film transistor is located between a buffer layer 510 and a first gate insulating layer 520, and the active layer P—Si is connected to the source electrode S and the drain electrode D. An interlayer insulating layer 540 is located between the gate electrode G and the source electrode S and drain electrode D. The first gate insulating layer 520 is located on a side of the interlayer insulating layer 540 facing a base substrate 110. A second gate insulating layer 530 is located between the interlayer insulating layer 540 and the first gate insulating layer 520. The first electrode ED1 of the capacitor is disposed in the same layer as the gate electrode G of the thin film transistor, and the second electrode ED2 of the capacitor is disposed between the interlayer insulating layer 540 and the second gate insulating layer 530.

The sub-pixel may further include a passivation layer 1901, a first planarization layer 1902, a transferring electrode 1903 and a second planarization layer 1904. The passivation layer 1901 is located on a side of the interlayer dielectric layer 540 away from the base substrate 110. The first planarization layer 1902 is located on a side of the passivation layer 1901 away from the base substrate 110. The transferring electrode 1903 is located on a side of the first planarization layer 1902 away from the base substrate 110, and the transferring electrode 1903 is connected to the source electrode S of the thin film transistor through via holes disposed in the first planarization layer 1902 and the passivation layer 1901. The second planarization layer 1904 is disposed on a side of the transferring electrode 1903 away from the base substrate 110 and at least partially covers the transferring electrode 1903.

The sub-pixel may also include a pixel defining layer 1905 and a light-emitting element, the light-emitting element includes an anode 1906, a light-emitting layer 1907 and a cathode 1908. The pixel defining layer 1905 is located on a side of the second planarization layer 1904 away from the base substrate 110. The anode 1906 is located on a side of the transferring electrode 1903 away from the base substrate 110 and is connected to the transferring electrode 1903. The light-emitting layer 1907 is located on a side of the anode 1906 away from the base substrate 110 and partially covers the anode 1906. The cathode 1908 is located on a side of the light-emitting layer 1907 away from the base substrate 110.

The sub-pixel may further include an encapsulation layer 1909 on a side of the cathode 1908 away from the base substrate 110. In some embodiments, the encapsulation layer 1909 may include a first inorganic encapsulation layer, an organic encapsulation layer and a second inorganic encapsulation layer that are sequentially stacked.

The first data wiring DL_a and the first connecting wiring CL_a in the above embodiment may be disposed in the same layer as the gate electrode G of the thin film transistor, the second data wiring DL_b and the second connecting wiring CL_b may be disposed in the same layer as the second electrode ED2 of the capacitor, and the third data wiring DL_c and the third connecting wiring CL_c may be disposed in the same layer as the source electrode S and/or the drain electrode D. The patterned wiring BL may be disposed in the same layer as the transferring electrode 1903.

The embodiments of the present disclosure also provide a display panel. The display panel may include the display substrate of any of the above-mentioned embodiments. In some embodiments, the display panel may be an Active-Matrix Organic Lighting-Emitting Diode (AMOLED) display panel.

It should be noted that in the above description, the technical solutions of the embodiments of the present disclosure are shown by way of example only, but it does not mean that the embodiments of the present disclosure are limited to the above steps and structures. Where possible, the steps and structure may be adjusted and selected as required. Therefore, some steps and units are not essential elements for implementing the overall inventive idea of the embodiments of the present disclosure.

The present disclosure has been described in conjunction with the preferred embodiments. It should be understood that those skilled in the art may make various other changes, substitutions and additions without departing from the spirit and scope of the embodiments of the present disclosure. Therefore, the scope of the embodiments of the present disclosure is not limited to the above specific embodiments, but should be defined by the appended claims.

What is claimed is:
1. A display substrate, comprising:
a base substrate comprising a display area and a peripheral area surrounding the display area;
a plurality of sub-pixels in the display area;
a plurality of data lines in the display area, wherein the plurality of data lines are arranged in a first direction and extend in a second direction, and the plurality of data lines are connected to the plurality of sub-pixels;
a plurality of data wirings in the peripheral area, wherein the plurality of data wirings are located on a side of the display area in the second direction, and the plurality of data wirings are respectively connected to the plurality of data lines,
wherein the plurality of data wirings comprises a first data wiring, a second data wiring and a third data wiring that are periodically arranged, wherein the first data wiring is located in a first conductor layer, the second data wiring is located in a second conductor layer, and the third data wiring is located in a third conductor layer, wherein the first conductor layer is located on a side of the base substrate facing the plurality of sub-pixels, the second conductor layer is located on a side of the first conductor layer away from the base substrate, the third conductor layer is located on a side of the second conductor layer away from the base substrate, and an orthographic projection of a part of at least one first data wiring on the base substrate overlaps with an orthographic projection of a part of at least one third data wiring on the base substrate;
wherein a bending area is disposed in the peripheral area, the bending area is located on a side of the plurality of data wirings away from the display area in the second direction, the display substrate further comprises a plurality of patterned wirings in the bending area, and the plurality of patterned wirings are correspondingly connected to the plurality of data wirings;
wherein the display substrate further comprises a plurality of connecting wirings in the peripheral area, wherein the plurality of connecting wirings are located on a side of the bending area away from the display area in the second direction, and the plurality of connecting wirings are correspondingly connected to the plurality of patterned wirings;
wherein the plurality of connecting wirings comprise a first connecting wiring, a second connecting wiring and a third connecting wiring that are periodically arranged, wherein the first connecting wiring is located in the first conductor layer, the second connecting wiring is located in the second conductor layer, and the third connecting wiring is located in the third conductor layer;
wherein each first data wiring is connected to one third connecting wiring through one patterned wiring, each second data wiring is connected to one third connecting wiring through one patterned wiring, and each third data wiring is connected to one first connecting wiring or one second connecting wiring through one patterned wiring;
wherein, in any two adjacent third data wirings, one third data wiring is connected to the first connecting wiring through one patterned wiring, the other one third data wiring is connected to the second connecting wiring through one patterned wiring;
wherein the display substrate further comprises an auxiliary circuit in the peripheral area, wherein the auxiliary circuit is located on a side of the plurality of connecting wirings away from the display area in the second direction,
the connecting wiring further comprise a third sub-connecting-wiring, the third sub-connecting-wiring is connected to the auxiliary circuit, a second sub-connecting-wiring is connected between a first sub-connecting-wiring and the third sub-connecting-wiring;

wherein the auxiliary circuit comprises an electrostatic discharging circuit, the electrostatic discharging circuit comprises a plurality of electrostatic discharging units, the plurality of electrostatic discharging units are connected to third sub-connecting-wirings of the plurality of connecting wirings in one-to-one correspondence.

2. The display substrate of claim 1, wherein each of the plurality of data wirings comprises a first sub-data-wiring, a second sub-data-wiring and a third sub-data-wiring, the first sub-data-wiring is connected to at least one data line of the plurality of data lines, the third sub-data-wiring is connected to at least one patterned wiring of the plurality of patterned wirings, and the second sub-data-wiring is connected between the first sub-data-wiring and the third sub-data-wiring, wherein an orthographic projection of the second sub-data-wiring of the at least one first data wiring on the base substrate at least partially overlaps with an orthographic projection of the second sub-data-wiring of the at least one third data wiring on the base substrate.

3. The display substrate of claim 2, wherein the plurality of data wirings are divided into a plurality of sets of data wirings, wherein third sub-data-wirings of two data wirings that belong to two adjacent sets and are adjacent to each other are separated by a first distance in the first direction, third sub-data-wirings of two data wirings that belong to the same set and are adjacent to each other are separated by a second distance in the first direction, and the second distance is smaller than the first distance.

4. The display substrate of claim 3, wherein the plurality of sets of data wirings comprise a first set of data wirings, a second set of data wirings, a third set of data wirings, a fourth set of data wirings, a fifth set of data wirings and a sixth set of data wirings arranged in the first direction, wherein the first set of data wirings and the sixth set of data wiring are symmetrically disposed with respect to a symmetry axis of the display substrate in the second direction, the second set of data wirings and the fifth set of data wirings are symmetrically disposed with respect to the symmetry axis, and the third set of data wirings and the fourth set of data wirings are symmetrically disposed with respect to the symmetry axis.

5. The display substrate of claim 2, wherein an orthographic projection of the second sub-data-wiring of at least one first data wiring on the base substrate completely overlaps with an orthographic projection of the second sub-data-wiring of at least one third data wiring on the base substrate, and an orthographic projection of the second sub-data-wiring of at least one second data wiring on the base substrate does not overlap with each of the orthographic projection of the second sub-data-wiring of at least one first data wiring on the base substrate and the orthographic projection of the second sub-data-wiring of at least one third data wiring on the base substrate.

6. The display substrate of claim 1, wherein at least one of the plurality of connecting wirings comprises a first sub-connecting-wiring and a second sub-connecting-wiring, the first sub-connecting-wiring is connected to one patterned wiring of the plurality of patterned wirings, and the second sub-connecting-wiring is connected to the first sub-connecting-wiring, wherein the first sub-connecting-wiring of at least one of the plurality of connecting wirings extends to respective patterned wiring in a polyline shape.

7. The display substrate of claim 5, wherein the plurality of connecting wirings are divided into a plurality sets of connecting wirings, wherein first sub-connecting-wirings of two connecting wirings that belong to two adjacent sets and are adjacent to each other are separated by a third distance in the first direction, first sub-connecting-wirings of two connecting wirings that belong to the same set and are adjacent to each other are separated by a fourth distance in the first direction, and the fourth distance is smaller than the third distance.

8. The display substrate of claim 7, wherein at least one set of connecting wirings is divided into a first sub-set of connecting wirings, a second sub-set of connecting wirings and a third sub-set of connecting wirings, and the first sub-set of connecting wirings and the third sub-set of connecting wirings are located on two sides of the second sub-set of connecting wirings respectively in the first direction, wherein, in the first sub-set of connecting wirings, a first sub-connecting-wiring of each of the first connecting wiring and the second connecting wiring extends in a polyline shape to the patterned wiring, and a part extending in polyline shape of the first sub-connecting-wiring of each of the first connecting wiring and the second connecting wiring has a length that gradually decreases in the first direction;

in the third sub-set of connecting wirings, a first sub-connecting-wiring of each of the first connecting wiring and the second connecting wiring extends in a polyline shape to the patterned wiring, and a part extending in polyline shape of the first sub-connecting-wiring of each of the first connecting wiring and the second connecting wiring has a length that gradually increases in the first direction.

9. The display substrate of claim 7, wherein the plurality of sets of connecting wirings comprise a first set of connecting wirings, a second set of connecting wirings, a third set of connecting wirings, a fourth set of connecting wirings, a fifth set of connecting wirings and a sixth set of connecting wirings arranged in the first direction, wherein the first set of connecting wirings and the sixth set of data wiring are symmetrically disposed with respect to a symmetry axis of the display substrate in the second direction, the second set of connecting wirings and the fifth set of connecting wirings are symmetrically disposed with respect to the symmetry axis, and the third set of connecting wirings and the fourth set of connecting wirings are symmetrically disposed with respect to the symmetry axis.

10. The display substrate of claim 1, wherein at least one of the plurality of sub-pixels comprises:

a thin film transistor having a gate electrode, a source electrode and a drain electrode;

an interlayer insulating layer located between the gate electrode and the source electrode and between the gate electrode and the drain electrode;

a first gate insulating layer located on a side of the interlayer insulating layer facing the base substrate;

a second gate insulating layer located between the interlayer insulating layer and the first gate insulating layer; and a capacitor, wherein a first electrode of the capacitor and the gate electrode are disposed in the same layer, a second electrode of the capacitor is disposed between the interlayer insulating layer and the second gate insulating layer, wherein the first data wiring and the gate electrode are disposed in the same layer, the second data wiring and the second electrode of the capacitor are disposed in the same layer, and the third data wiring is disposed in a layer where the source electrode or the drain electrode is disposed.

11. The display substrate of claim 1, wherein at least one electrostatic discharging unit comprises a first transistor, a second transistor, a third transistor and a fourth transistor, a gate electrode and a first electrode of the first transistor, a gate electrode and a first electrode of the second transistor, a second electrode of the third transistor and a second electrode of the fourth transistor are connected to respective one third sub-connecting-wiring, a second electrode of the first transistor and a second electrode of the second transistor are connected to a low voltage signal line, and a gate electrode and a first electrode of the third transistor and a gate electrode and a first electrode of the fourth transistor are connected to a high voltage signal line.

12. The display substrate of claim 1, wherein the auxiliary circuit further comprises a unit testing circuit, the unit testing circuit comprises a plurality of unit testing sub-circuits, the plurality of unit testing sub-circuits are connected to the third sub-connecting-wirings of the plurality of connecting wirings in one-to-one correspondence.

13. A display panel comprising the display substrate of claim 1.

* * * * *